US012652901B2

(12) United States Patent
Yamamoto et al.

(10) Patent No.: US 12,652,901 B2

(45) Date of Patent: Jun. 9, 2026

(54) COLOR STABLE ORGANIC LIGHT EMITTING DIODE STACK

(71) Applicant: Universal Display Corporation, Ewing, NJ (US)

(72) Inventors: Hitoshi Yamamoto, Pennington, NJ (US); Xin Xu, Plainsboro, NJ (US); Michael S. Weaver, Princeton, NJ (US); Vadim Adamovich, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 818 days.

(21) Appl. No.: 17/491,646

(22) Filed: Oct. 1, 2021

(65) Prior Publication Data

US 2022/0020945 A1 Jan. 20, 2022

Related U.S. Application Data

(63) Continuation of application No. 16/688,767, filed on Nov. 19, 2019, now Pat. No. 11,145,837, which is a (Continued)

(51) Int. Cl.

*H10K 50/13* (2023.01)

*H10K 50/11* (2023.01)

(Continued)

(52) U.S. Cl.

CPC ........... *H10K 50/131* (2023.02); *H10K 50/11* (2023.02); *H10K 2101/10* (2023.02); *H10K 2102/351* (2023.02); *H10K 2102/361* (2023.02)

(58) Field of Classification Search

CPC .. H10K 50/131; H10K 50/11; H10K 2101/10; H10K 2102/361; H10K 2102/351; H10K 50/13

See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |

(Continued)

FOREIGN PATENT DOCUMENTS

| | | |
|---|---|---|
| CN | 101714613 | 5/2010 |
| CN | 101842372 | 9/2010 |

(Continued)

OTHER PUBLICATIONS

Chinese Office Action (with partial English translation) issued in App. No. CN202010743857, dated Dec. 19, 2023, 9 pages.

(Continued)

*Primary Examiner* — Eric W Jones

*Assistant Examiner* — Sean Ayers Winters

(74) *Attorney, Agent, or Firm* — Butzel Long

(57) ABSTRACT

The present invention relates to OLED devices and stacks for OLED devices that include a symmetric emissive-layer architecture. In one embodiment, the present invention relates to an emissive stack having three layers, wherein the top and bottom layers emit light in the same or similar color region while the middle layer emits light in a different color region than the other two layers. In such an embodiment, the three layers are in contact with each other with no other layers in between. The symmetric emissive-layer architecture of the present invention can be used to improve the color stability of OLED devices.

20 Claims, 18 Drawing Sheets

Related U.S. Application Data continuation-in-part of application No. 14/612,361, filed on Feb. 3, 2015, now Pat. No. 10,510,973.

(60) Provisional application No. 62/879,606, filed on Jul. 29, 2019, provisional application No. 62/093,104, filed on Dec. 17, 2014.

(51) Int. Cl.
*H10K 101/10* (2023.01)
*H10K 102/00* (2023.01)

(56) References Cited

U.S. PATENT DOCUMENTS

| | | | | |
|---|---|---|---|---|
| 5,703,436 | A | 12/1997 | Forrest | |
| 5,707,745 | A | 1/1998 | Forrest | |
| 5,834,893 | A | 11/1998 | Bulovic | |
| 5,844,363 | A | 12/1998 | Gu | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 7,279,704 | B2 | 10/2007 | Walters | |
| 7,431,968 | B1 | 10/2008 | Shtein | |
| 7,948,165 | B2 * | 5/2011 | Spindler | H10K 50/19 313/506 |
| 7,968,146 | B2 | 6/2011 | Wagner | |
| 2003/0230980 | A1 | 12/2003 | Forrest | |
| 2004/0174116 | A1 | 9/2004 | Lu | |
| 2005/0242712 | A1 | 11/2005 | Sung | |
| 2005/0264550 | A1 * | 12/2005 | Ohshima | G09G 3/3233 345/204 |
| 2006/0251921 | A1 | 11/2006 | Forrest | |
| 2006/0273714 | A1 | 12/2006 | Forrest | |
| 2006/0279203 | A1 | 12/2006 | Forrest | |
| 2007/0035240 | A1 | 2/2007 | Yang | |
| 2008/0238305 | A1 | 10/2008 | Kondo | |
| 2008/0278066 | A1 * | 11/2008 | Spindler | H10K 50/19 313/504 |
| 2008/0309227 | A1 | 12/2008 | Che | |
| 2009/0146552 | A1 | 6/2009 | Spindler | |
| 2009/0294778 | A1 | 12/2009 | Mitsuya | |
| 2010/0078631 | A1 | 4/2010 | Pieh | |
| 2010/0314612 | A1 | 12/2010 | Lee | |
| 2013/0026452 | A1 | 1/2013 | Kottas | |
| 2013/0119354 | A1 | 5/2013 | Ma | |
| 2013/0240849 | A1 * | 9/2013 | Chiang | H10K 59/38 257/40 |
| 2013/0320837 | A1 * | 12/2013 | Weaver | H10K 50/13 313/504 |
| 2014/0084269 | A1 | 3/2014 | Weaver | |
| 2014/0197389 | A1 * | 7/2014 | Adamovich | H10K 50/121 257/40 |
| 2015/0001502 | A1 | 1/2015 | Seo | |
| 2015/0060812 | A1 * | 3/2015 | Kim | H10K 59/32 257/40 |
| 2015/0060922 | A1 | 3/2015 | Wilcox | |
| 2015/0102331 | A1 | 4/2015 | Seo | |
| 2015/0171359 | A1 | 6/2015 | Forrest | |
| 2015/0188067 | A1 | 7/2015 | Lee | |
| 2015/0228932 | A1 * | 8/2015 | Ma | H10K 50/131 257/40 |
| 2015/0280160 | A1 | 10/2015 | Lee | |
| 2016/0181560 | A1 | 6/2016 | Yamamoto | |
| 2017/0125487 | A1 | 5/2017 | Song | |
| 2017/0229663 | A1 | 8/2017 | Tsai | |
| 2017/0250234 | A1 | 8/2017 | He | |
| 2017/0338432 | A1 | 11/2017 | Adamovich | |
| 2018/0151630 | A1 | 5/2018 | Yamaoka | |
| 2019/0196071 | A1 * | 6/2019 | Barrett | G02B 5/22 |

FOREIGN PATENT DOCUMENTS

| | | | |
|---|---|---|---|
| CN | 101919083 | | 12/2010 |
| CN | 105720201 | A | 6/2016 |
| EP | 1238981 | A2 | 9/2002 |
| JP | 2008270190 | A | 11/2008 |
| JP | 2010135467 | A | 6/2010 |
| JP | 2012212575 | A | 11/2012 |
| JP | 2013229268 | A | 11/2013 |
| KR | 20070060196 | A | 6/2007 |
| KR | 20120041460 | A | 5/2012 |
| KR | 20150044402 | A | 4/2015 |
| KR | 20160073906 | A | 6/2016 |
| WO | 2004111066 | A1 | 12/2004 |
| WO | 2008044723 | A1 | 4/2008 |
| WO | 2008057394 | A1 | 5/2008 |
| WO | 2010011390 | A2 | 1/2010 |
| WO | 2010111175 | A1 | 9/2010 |
| WO | 2013161515 | A1 | 10/2013 |

OTHER PUBLICATIONS

Korean Office Action (with English translation) for App. No. KR10-2015-0150758, dated Jan. 7, 2022, 14 pages.

Zheng, T. and Choy, W. C. H. High efficiency blue organic LEDs achieved by an integrated fluorescence—interlayer—phosphorescence emission architecture. Adv. Funct. Mater. 20 (2010) 648-655 (Year: 2010).

Sun, S. S. and Dalton, L. R. (eds) Introduction to Organic Electronic and Optoelectronic Materials and Devices. CRC Press, Boca Raton, FL (2008) 366-371.

Yang, SH, Shih, PJ, and Wu, WJ. Electroluminescence of fluorescent-phosphorescent organic light-emitting diodes with regular, inverted, and symmetrical structures. Optical Materials, 37 (2014) 376-381.

Lee, YH, et al. Balancing the white emission of OLED by a design of fluorescent blue and phosphorescent green/red emitting layer structures. Synthetic Metals, 159 (2009) 325-330.

Baldo et al. "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Extended European Search Report for App. No. EP20187819.6, dated Jan. 11, 2021, 9 pages.

Jung Soo Park et al: "Two-color-mixed white organic light-emitting diodes with a high color temperature", Journal of Information Display, vol. 12, No. 1, Mar. 1, 2011 (Mar. 1, 2011), pp. 51-55, XP055759505, ISSN: 1598-0316, DOI: 10.1080/15980316.2011.563059.

Gyeong Woo Kim et al: "Highly efficient single-stack hybrid cool white OLED utilizing blue thermally activated delayed fluorescent and yellow phosphorescent emitters", Scientific Reports, vol. 8, No. 1, Nov. 2, 2018 (Nov. 2, 2018), XP055759338, DOI: 10.1038/s41598-018-34593-3.

Korean Office Action (with English translation) for App. No. KR10-2015-0150758, dated Mar. 8, 2021, 19 pages. .

Korean Office Action (including English translation) issued in App. No. KR10-2020-0093944, dated Mar. 14, 2024, 9 pages.

* cited by examiner

| |
|---|
| Electrode |
| Emissive Stack (e.g. blue, red/green/red, green/blue/green) |
| Charge Generation Layer |
| Emissive Stack (e.g. blue, red/green/red, green/blue/green) |
| Charge Generation Layer |
| Emissive Stack (e.g. blue, red/green/red, green/blue/green) |
| Charge Generation Layer |
| Emissive Stack (e.g. blue, red/green/red, green/blue/green) |
| Electrode |

COLOR STABLE ORGANIC LIGHT EMITTING DIODE STACK

CROSS-REFERENCE TO RELATED APPLICATIONS

This application is a continuation of U.S. patent application Ser. No. 16/688,767, filed Nov. 19, 2019, which is a continuation-in-part of U.S. patent application Ser. No. 14/612,361, filed Feb. 3, 2015, which claims priority to U.S. Patent Application Ser. No. 62/093,104, filed Dec. 17, 2014, the entire contents of each of which are incorporated herein by reference.

FIELD OF THE INVENTION

The present invention relates to emissive-layer stacks for organic light emitting diodes and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

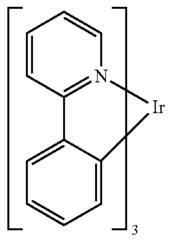

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" or "adjacent to" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than", "higher than", or "shallower than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level. Similarly, a "deeper" HOMO or LUMO refers to an energy level that is further from the vacuum energy level, i.e., an energy level having a larger absolute value (typically more negative as shown on, for example, energy level diagrams).

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

As used herein, a "red" layer, material, region, or device refers to one that has an emission spectrum with a peak wavelength in the range of about 580-700 nm; a "green" layer, material, region, or device refers to one that has an emission spectrum with a peak wavelength in the range of about 500-600 nm; a "blue" layer, material, or device refers to one that has an emission spectrum with a peak wavelength in the range of about 400-500 nm; and a "yellow" layer, material, region, or device refers to one that has an emission spectrum with a peak wavelength in the range of about 540-600 nm. In some arrangements, separate layers, materials, regions, or devices may provide separate "deep blue" and "light blue" light components. As used herein, in arrangements that provide separate "light blue" and "deep blue" light components, the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some embodiments.

Many OLEDs known in the art contain multiple emissive layers. For example, a white OLED may include two to three emissive layers. Such devices can be optimized by pinning down the recombination zone at the interface of emissive layers to attempt to achieve color stability at various driving conditions. However, even in an optimized structure, the multi-layer OLED device can still exhibit a color that varies with different driving currents. This illustrates that the color stability of the device needs improvement.

Thus, there is a need in the art for an OLED device with multiple emissive layers that has improved color stability. The present invention addresses this need in the art.

SUMMARY OF THE INVENTION

According to aspects of the disclosed subject matter, an organic light emitting device is provided that includes a first electrode; a first emissive stack disposed over the first electrode; and a second electrode disposed over the first emissive stack; wherein the first emissive stack consists of N emissive layers in contact and in sequence from the first electrode side; wherein N is an integer of at least 3; wherein the first emissive layer in the first emissive stack nearest the first electrode and the Nth emissive layer in the first emissive stack nearest the second electrode emit light in the same color region, and wherein at least one emissive layer in the first emissive stack other than the first and the Nth emissive layers emits light in a different color region than the first and the Nth emissive layers. In one embodiment, the difference between the emission peak of the first emissive layer and the emission peak of the Nth emissive layer is less than about 10 nm. In one embodiment, the difference between the emission peaks of the first and Nth emissive layers and the emission peak of any other emissive layer is greater than about 10 nm. In one embodiment, the first and the Nth emissive layers are red emissive layers. In one embodiment, the at least one emissive layer in the first emissive stack other than the first and the Nth emissive layers is a green emissive layer. In one embodiment, the first and the Nth emissive layers are green emissive layers. In one such embodiment, at least one emissive layer in the first emissive stack other than the first and the Nth emissive layers is a red emissive layer. In one embodiment, the first and the Nth emissive layers are yellow emissive layers. In one such embodiment, at least one emissive layer in the first emissive stack other than the first and the Nth emissive layers is a blue emissive layer. In one embodiment, the first and the Nth emissive layers are blue emissive layers. In one such embodiment, at least one emissive layer in the first emissive stack other than the first and the Nth emissive layers is a yellow emissive layer.

In one embodiment, the device emits white light. In one embodiment, each emissive layer in the first emissive stack comprises at least one host material and at least one emissive dopant. In one embodiment, the composition of the at least one emissive dopant in the first emissive layer is the same as that of the at least one emissive dopant in the Nth emissive layer. In one embodiment, the composition and the doping concentration of the at least one emissive dopant in the first emissive layer is the same as those of the at least one emissive dopant in the Nth emissive layer. In one embodiment, the composition, doping concentration, and thickness of the first and Nth emissive layers are the same. In one embodiment, the at least one emissive dopant in each emissive layer in the first emissive stack is a phosphorescent emissive dopant. In one embodiment, the phosphorescent dopant is an Iridium complex. In one embodiment, at least one emissive layer in the first emissive stack comprises a phosphorescent dopant, and at least one emissive layer in the first emissive stack comprises a fluorescent dopant. In one embodiment, when at least one emissive layer is a yellow emissive layer and at least one emissive layer is a blue emissive layer, the at least one yellow emissive layer includes a phosphorescent dopant and the at least one blue emissive layer includes a phosphorescent dopant. In one embodiment, when at least one emissive layer is a yellow emissive layer and at least one emissive layer is a blue emissive layer, the at least one yellow emissive layer includes a phosphorescent dopant and the at least one blue emissive layer includes a fluorescent dopant. In one embodiment, N is 3 or 4. In one embodiment, the change in each 1931 CIE (x, y) color coordinate of light emitted from the first emissive stack is 0.02 or less for any change in current density within the range of about 2 $mA/cm^2$ to 80 $mA/cm^2$. In one embodiment, the change in each 1931 CIE (x, y) color coordinate of light emitted from the first emissive stack is 0.02 or less for any change in luminance within the range of about 800 $cd/m^2$ to 30,000 $cd/m^2$. In one embodiment, the $\Delta uv$ value of light emitted from the first emissive stack is less than 0.02 when the device is aged to 70% of its initial luminance (LT70). In one embodiment, the device also includes a second emissive stack between the first and second electrodes, wherein the second emissive stack is not in contact with the first emissive stack. In one embodiment, the second emissive stack has M emissive layers in contact and in sequence from the first electrode side; M is an integer of 3 or higher; the first emissive layer of the second emissive stack nearest the first electrode and the Mth emissive layer in the second emissive stack nearest the second electrode emit light in the same color region, and at least one emissive layer in the second emissive stack other than the first and the Mth emissive stack layers emits light in a different color region than the first and the Mth layers in the second emissive stack. In one embodiment, the device further comprises a charge generation layer (CGL) disposed between the first and second emissive stack. In one embodiment, the first and Mth layers in the second emissive stack emit light in the same color region as the first and Nth layers in the first emissive stack. In one embodiment, the first and Nth layers in the first emissive stack and the first and Mth layers in the second emissive stack are blue emissive layers. In one embodiment, the first and Nth layers of the first emissive stack and the first and Mth layers of the second emissive stack are yellow emissive layers. In one embodiment, the first and Nth layers of the first emissive stack and the first and Mth layers of the second emissive stack are red emissive layers. In one embodiment, the first and Nth layers of the first emissive stack and the first and Mth layers of the second emissive stack are green emissive layers. In one embodiment, the device includes at least one emissive layer between the first and second electrodes and not in contact with the first emissive stack, said layer comprising a fluorescent blue dopant. In one embodiment, the change in each 1931 CIE (x, y) color coordinate of light emitted from the second emissive stack is 0.02 or less for any change in current density within the range of about 2 $mA/cm^2$ to 80 $mA/cm^2$. In one embodiment, the change in each 1931 CIE (x, y) color coordinate of light emitted from the second emissive stack is 0.02 or less for any change in luminance within the range of about 800 $cd/m^2$ to 30,000 $cd/m^2$. In one embodiment, the $\Delta uv$ value of light emitted from the second emissive stack is less than 0.02 when the stack is aged to 70% of its initial luminance (LT70).

According to aspects of the disclosed subject matter, another embodiment of an organic light emitting device is provided that includes a first electrode; a second electrode; and at least one emissive layer stack disposed between the first and second electrodes; wherein the at least one emissive layer stack has a top emissive layer, R middle emissive layers and a bottom emissive layer in contact and in sequence; wherein R is an integer of at least 1; wherein each emissive layer comprises at least one host material and at least one light emitting dopant; and wherein the at least one light emitting dopant in the top and bottom emissive layers is the same. In one embodiment, the at least one light emitting dopant in at least one of the R middle emissive layers is different than the at least one light emitting dopant in both the top and bottom emissive layers. In one embodiment, R is 1. In one embodiment, the at least one light emitting dopant in the top and bottom emissive layers is a red light emitting dopant. In one embodiment, the at least one light emitting dopant in at least one of the R middle emissive layers is a green light emitting dopant. In one embodiment, the at least one light emitting dopant in the top and bottom emissive layers is a green light emitting dopant. In one embodiment, the at least one light emitting dopant in at least one of the R middle emissive layers is a red light emitting dopant. In one embodiment, the at least one light emitting dopant in the top and bottom emissive layers is a yellow light emitting dopant. In one embodiment, the at least one light emitting dopant in at least one of the R middle emissive layers is a blue light emitting dopant. In one embodiment, the at least one light emitting dopant in the top and bottom emissive layers is a blue light emitting dopant. In one embodiment, the at least one light emitting dopant in at least one of the R middle emissive layers is a yellow light emitting dopant.

According to aspects of the disclosed subject matter, a light emitting stack for an organic light emitting device is provided that includes a top emissive layer; a bottom emissive layer; and S middle emissive layers; wherein S is an integer of at least 1; wherein the top emissive layer, S middle emissive layers and the bottom emissive layer are in contact and in sequence; and wherein the top and bottom emissive layers emit light in the same color region, and at least one layer of the S middle emissive layers emits light in a different color region than the top and bottom emissive layers. In one embodiment, each emissive layer comprises at least one host material and at least one emissive dopant. In one embodiment, the at least one light emitting dopant in the top and bottom emissive layers is a red light emitting dopant. In one embodiment, the at least one light emitting dopant in at least one of the S middle emissive layers is a green light emitting dopant. In one embodiment, the at least one light emitting dopant in the top and bottom emissive layers is a green light emitting dopant. In one embodiment, the at least one light emitting dopant in at least one of the S middle emissive layers is a red light emitting dopant. In one embodiment, the at least one light emitting dopant in the top and bottom emissive layers is a yellow light emitting dopant. In one embodiment, the at least one light emitting dopant in at least one of the S middle emissive layers is a blue light emitting dopant. In one embodiment, the at least one light emitting dopant in the top and bottom emissive layers is a blue light emitting dopant. In one embodiment, the at least one light emitting dopant in at least one of the S middle emissive layers is a yellow light emitting dopant.

According to aspects of the disclosed subject matter, an organic light emitting device is provided that includes a first electrode; a first emissive stack disposed over the first electrode; and a second electrode disposed over the first emissive stack, where the first emissive stack consists of N emissive layers in contact and in sequence from the first electrode side, N is an integer of at least 3, the first emissive layer in the first emissive stack nearest the first electrode and the Nth emissive layer in the first emissive stack nearest the second electrode emit light in the same color region, at least one emissive layer in the first emissive stack other than the first and the Nth emissive layers emits light in a different color region than the first and the Nth emissive layers, and at least one of the emissive layers between the first emissive layer and the Nth emissive layer has a thickness that is at least two times a thickness of the first emissive layer. The at least one emissive layer between the first emissive layer and the Nth emissive layer may have a thickness that is at least three times the thickness of the first emissive layer. The at least one emissive layer between the first emissive layer and the Nth emissive layer may have a thickness that is at least five times the thickness of the first emissive layer. The at least one emissive layer between the first emissive layer and the Nth emissive layer may have a thickness that is at least two times the thickness of the first emissive layer and not more than ten times the thickness of the first emissive layer. The difference between the emission peak of the first emissive layer and the emission peak of the Nth emissive layer may be less than about 10 nm. The difference between the emission peaks of the first and Nth emissive layers and the emission peak of any other emissive layer may be greater than about 10 nm. The first and the Nth emissive layers may be red emissive layers, and at least one emissive layer in the first emissive stack other than the first and the Nth emissive layers may be a green emissive layer. Alternatively, the first and the Nth emissive layers may be green emissive layers and at least one emissive layer in the first emissive stack other than the first and the Nth emissive layers may be a red emissive layer. As another alternative, the first and the Nth emissive layers may be yellow emissive layers and at least one emissive layer in the first emissive stack other than the first and the Nth emissive layers may be a blue emissive layer. Alternatively, the first and the Nth emissive layers may be blue emissive layers and at least one emissive layer in the first emissive stack other than the first and the Nth emissive layers may be a yellow emissive layer. The emissive layer in the first emissive stack may include at least one host material and at least one emissive dopant and the composition of the at least one emissive dopant in the first emissive layer may be the same as that of the at least one emissive dopant in the Nth emissive layer. The at least one emissive dopant in each emissive layer in the first emissive stack may be a phosphorescent emissive dopant. At least one emissive layer in the first emissive stack may include a phosphorescent dopant, and at least one emissive layer in the first emissive stack may include a fluorescent dopant. The change in each 1931 CIE (x, y) color coordinate of light emitted from the first emissive stack may be 0.02 or less for any change in current density within the range of about 2 $mA/cm^2$ to 80 $mA/cm^2$. Alternatively or in addition, the change in each 1931 CIE (x, y) color coordinate of light emitted from the first emissive stack may be 0.02 or less for any change in luminance within the range of about 800 $cd/m^2$ to 30,000 $cd/m^2$. The $\Delta uv$ value of light emitted from the first emissive stack may be less than 0.02 when the device is aged to 70% of its initial luminance (LT70). The device may also include a second emissive stack between the first and second electrodes, where the second emissive stack is not in contact with the first emissive stack, and the second emissive stack has M emissive layers in contact and in sequence from the first electrode side, with M being an integer of 3 or higher, where the first emissive layer of the second emissive stack nearest the first electrode and the Mth emissive layer in the second emissive stack nearest the second electrode emit light in the same color region, and at least one emissive layer in the second emissive stack other than the first and the Mth emissive layers emits light in a different color region than the first and the Mth layers in the second emissive stack. The device further may include a charge generation layer (CGL) disposed between the first emissive stack and the second emissive stack. The device further may include at least one emissive layer between the first and second electrodes and not in contact with the first emissive stack, which may include a fluorescent blue dopant.

According to aspects of the disclosed subject matter, an organic light emitting device is provided that includes a first electrode; a hole transport layer disposed over the first electrode; and an emissive stack disposed over the first electrode. The emissive stack may include a first emissive layer including a first emitter of a first color; a second emissive layer in direct physical contact with the first emissive layer and including a second emitter of a second color different than the first color; and a third emissive layer in direct physical contact with the second emissive layer and including a third emitter, different than the first emitter, of the first color. The device may further include an electron transport layer disposed over the emissive stack and a second electrode disposed over the emissive stack. The first emissive layer may emit light having a first peak wavelength and the third emissive layer emits light having a second peak wavelength within not more than 5-10 nm of the first peak wavelength. The first and third emitters may include red emissive materials. The first emitter may have a HOMO energy level that is at least 0.1-0.5 eV deeper than a HOMO energy level of the third emitter. The first emitter may have a HOMO energy level that is at least 0.1-0.5 eV shallower than a HOMO energy level of the third emitter. The first emitter may have a LUMO energy level that is at least 0.1-0.5 ev deeper than a LUMO of the third emitter. The first emitter may have a LUMO energy level that is at least 0.1-0.5 eV shallower than a LUMO energy level of the third emitter. The first emissive layer may include a first host material, the second emissive layer may include a second host material, and the third emissive layer may include a third host material. The first host material may be the same as or different than the third host material. At least one of the first emissive layer and the third emissive layer may include a co-host material that comprises the second emitter. The first host material may have a HOMO energy level that is at least 0.1-0.5 eV shallower than a HOMO energy level of the third host material. The first host material may have a HOMO energy level that is at least 0.1-0.5 eV deeper than a HOMO energy level of the third host material. The first host material may have a LUMO energy level that is at least 0.1-0.5 eV shallower than a LUMO energy level of the third host material. The first host material may have a LUMO energy level that is at least 0.1-0.5 eV deeper than a LUMO energy level of the third host material. Each or either of the first and third host materials may a hole transporting cohost material and an electron transporting cohost material. The concentration of the hole transporting cohost material in the first host material may be at least 1.5 times the concentration of the hole transporting cohost material in the third host material. The second host material may include a hole transporting cohost material and an electron transporting cohost material. The third emissive layer may have a thickness at least twice a thickness of the first emissive layer. The second emissive layer may have a thickness that is at least twice a thickness of the third emissive layer. The first and third emissive layers may have the same thickness or different thicknesses. At least one emissive layer disposed between the first emissive layer and the third emissive layer may have a thickness that is at least twice the thickness of the first emissive layer.

In one embodiment, the device can be a consumer product, an organic light-emitting device, and/or a lighting panel. In one embodiment, the device can be included in a product, wherein the product is selected from the group consisting of: a touchscreen, a flat panel display, a computer monitor, a medical monitor, a television, a billboard, a general illumination device, a signal, a heads up display, a fully transparent display, a flexible display, a laser printer, a telephone, a cell phone, a personal digital assistant (PDA), a laptop computer, a digital camera, a camcorder, a viewfinder, a microdisplay, a vehicle, a large area wall, a theater, a stadium screen, and a sign.

BRIEF DESCRIPTION OF THE DRAWINGS

FIGS. 3A through 3D, shows a series of four OLED devices. FIG. 3A: reference OLED device having two emissive layers (EML) (namely, red bottom EML and green top EML). FIG. 3B: reference OLED device having two emissive layers (namely, green bottom EML and red top EML). FIG. 3C: device according to an embodiment of the present invention having a three-emissive layer stack for superior color stability (namely, a red bottom EML followed by a green EML and then followed by another similar red EML on top). FIG. 3D: a general architecture according to an embodiment of the present invention having a three-emissive layer stack for superior color stability. In one embodiment, the EML #1 and EML #2 are different colors, and EML #1 and EML #3 are similar colors, with <10 nm difference in emission peaks. For example, the three-EML-stack can be a red-green-red stack for overall yellow emission, or it can be a yellow-blue-yellow stack for a white OLED (WOLED).

FIGS. 5A through 5D, shows several color-stable white OLED architectures according to embodiments of the present invention. FIG. 5A: a single-stack white OLED with B-Y-B or Y-B-Y EML stacks. Y can also be replaced by R and G EMLs. FIG. 5B: the tandem architecture may have two or more white OLED stack with B-Y-B or Y-B-Y EML stacks. Y EML can also be R/G EMLs. FIGS. 5C and 5D: tandem architecture containing one or more hybrid blue stacks and one or more phosphorescent RG stacks. The phosphorescent RG stack can have either R-G-R or G-R-G EML stacks.

FIG. 6, comprising

FIG. 7, comprising

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
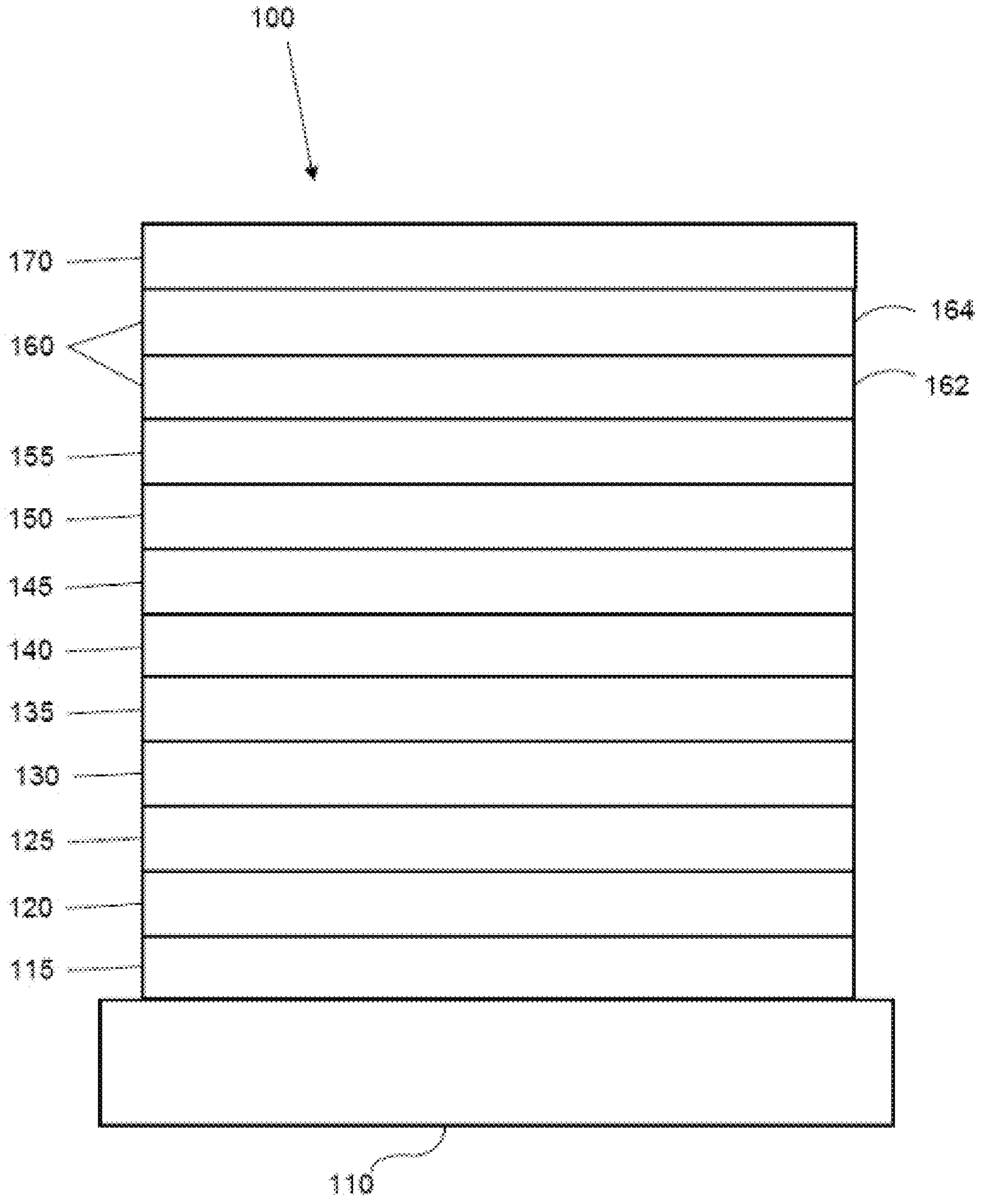
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
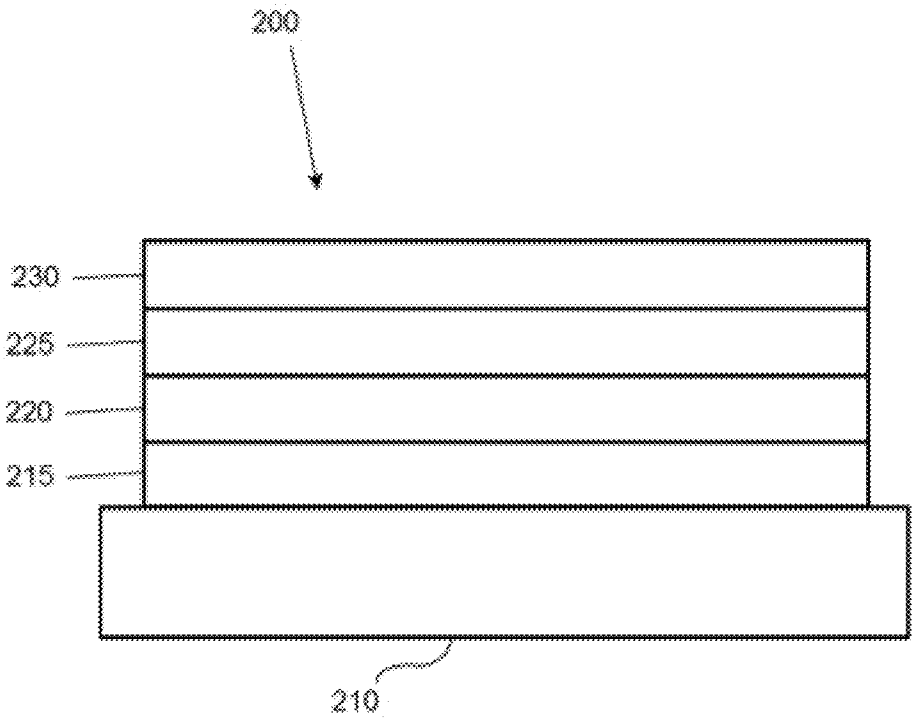
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structures illustrated in FIGS. 1 and 2 and more complicated multi EML layer structures illustrated in FIGS. 3A-3D are provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1, 2 and 3.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Many organic light-emitting diodes (OLEDs) known in the art contain multiple emissive layers. For example, a white OLED may include two to three emissive layers, or the yellow stack of a hybrid white OLED may include two or three red and green emissive layers. Accordingly, the optimization of such devices typically requires charge balance and "pinning down" or confining the recombination zone at the interface of emissive layers. However, even in an optimized structure, the color may still vary when the device is driven at various currents. This illustrates that the color stability of the device needs improvement.

Described herein is a light emitting stack that includes three emissive layers which are adjacent to each other without any other layer in between the three emissive layers. In one embodiment, the bottom emissive layer and the top emissive layer emit light of two same or substantially similar colors, while the middle emissive layer emits light of a color different than the bottom and top layers. In such an embodiment, minimum color shift can be achieved during variation of driving conditions.

Figure 3:
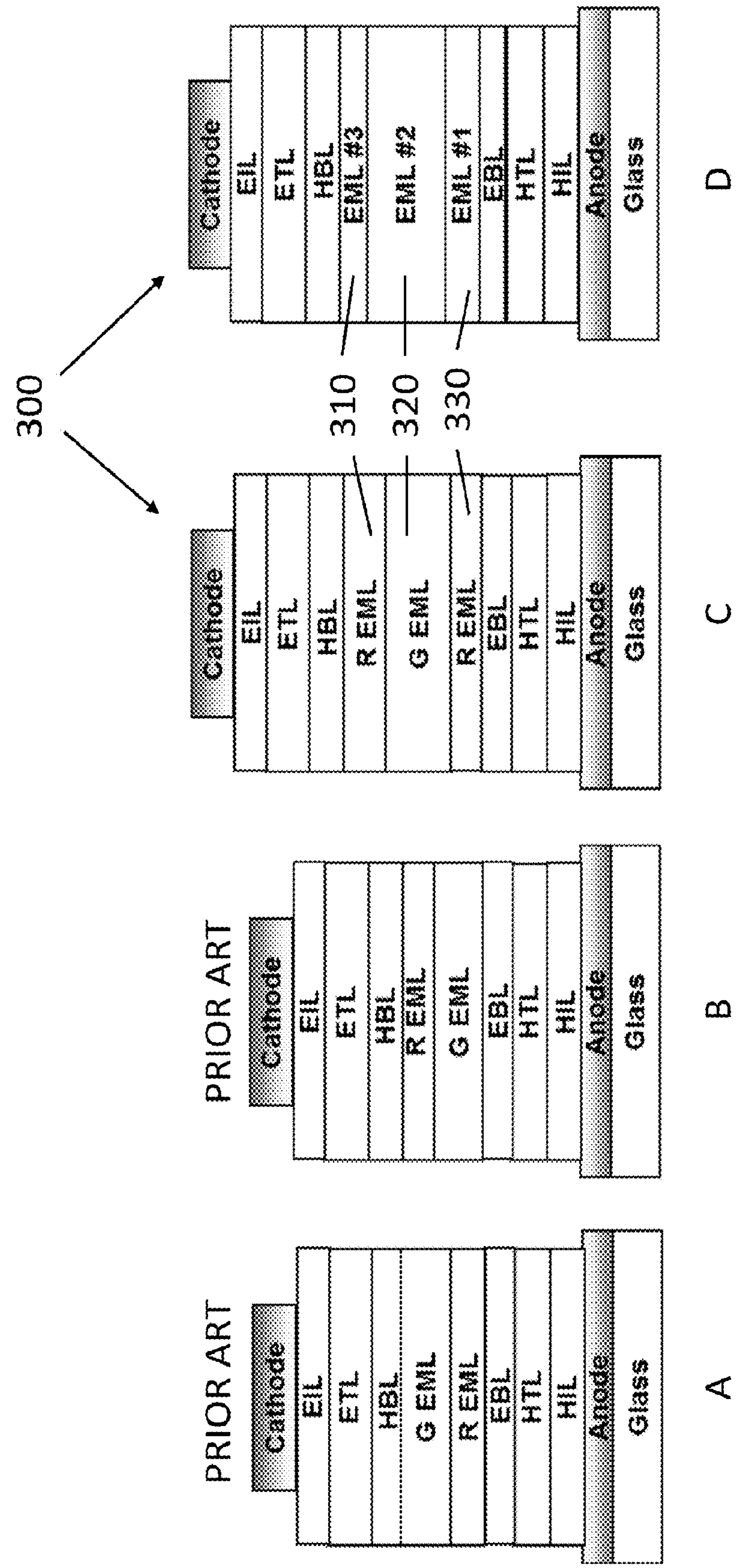
FIG. 3, comprising

As contemplated herein, the symmetric design of the light emitting stack can significantly benefit the color stability of an OLED. This significantly improved structure has the recombination zone pinned down at the interface of the emissive layers. Because of the symmetry of the structure, a slight shift of the recombination zone due to variation in driving conditions will not alter the emission characteristics of the device. Accordingly, the light emitting stack is a very color-stable multiple-layer structure that can be used in bottom emission, bottom emission microcavity, and top emission microcavity structures. The stack can also be used as a single component (e.g., a yellow component) in conjunction with one or more other emissive stacks in an OLED to make a color-stable OLED device (e.g., a yellow stack with a blue stack in a tandem or stacked white OLED). Referring now to FIG. 3, a series of OLED device architectures is shown. In one embodiment, device 300, as shown in FIGS. 3C and 3D, includes an emissive layer stack that contains a top emissive layer 310, a middle emissive layer 320, and a bottom emissive layer 330. Top emissive layer 310 emits light of the same or similar color as bottom emissive layer 330 (i.e., red light (R) in FIG. 3C), while middle emissive layer 320 emits light of a different color than emissive layers 310 and 330 (i.e., green light (G) in FIG. 3C). Further, emissive layers 310, 320, and 330 are adjacent to or otherwise in contact with each other, and there are no other layers in between emissive layers 310, 320, and 330. Accordingly, the recombination zone is confined due to the symmetric layer architecture. Conversely, the prior art comparison devices shown in FIGS. 3A and 3B have only two emissive layers, with the two emissive layers emitting a different color light from each other. In such prior art device architectures, the recombination zone can shift from one side of the emissive stack to the other, which can result in higher color shift when currents are varied, in comparison to the symmetric stack architecture of the present invention. However, the architecture shown in device 300 represents an unexpected and significant improvement over such prior art architectures.

Throughout this disclosure, the top emissive layer and the bottom emissive layer of the emissive stack of the present invention are referred to as having the same or similar color, emitting the same color light, emitting light in the same color region, and the like. These terms or phrases are used interchangeably herein, and they generally refer to layers emitting light with the same or substantially similar emission peaks. For example, in one embodiment, two emissive layers are considered to emit the same color if there is a difference in emission peaks of the two layers of less than 10 nm. In other embodiments, the two emissive layers are considered to emit the same color if the difference in emission peaks of the two layers is less than 5 nm, 8 nm, 11 nm, 12 nm, 13 nm, 14 nm, 15 nm, 20 nm, 25 nm, 30 nm, 40 nm, or 50 nm. However, the emission layers described herein are not limited to the specific emission peak criteria values listed above, and the difference in emission peaks of the two layers can be any difference that a person skilled in the art would consider to represent layers emitting the same or similar color. Further, it is contemplated herein that any methods or technique of quantifying whether layers have the same or similar color may be used, and the light output of the three emissive layers may be driven per such measurements. Accordingly, the emissive layer stacks described herein are not limited to using emission peaks to classify layers as having the same or similar color, and any other method or measurement can be used to quantify the color of light emitted from an emissive layer, as would be understood by a person skilled in the art.

For example, the same or similar color can be defined by comparing the 1931 CIE (x, y) color coordinates of two devices that are each grown with a single emissive layer. The two devices are made with identical structures, except that one device has an emissive layer corresponding to the top emissive layer (i.e., the same composition and thickness as the top emissive layer to be used in an OLED device having the architecture described herein), and the other device has an emissive layer corresponding to the bottom emissive layer. If these two devices emit light having 1931 CIE x and 1931 CIE y coordinates within 0.05, preferably within 0.03, or more preferably within 0.01 difference of each other, then the top and bottom emissive layers described in the light emitting stack emit light in the same color region for the purposes of this disclosure.

As previously described, the present invention relates to a three-layer emissive stack with a symmetrical architecture that confines the recombination zone to the interfaces between the three layers. Each of the three layers can be any color or have any emission peak provided that when the layers are fabricated into an OLED device, the colors of the top and bottom layers are adequately similar to each other, but sufficiently different from the color of the middle layer, such that the device exhibits an improvement in color stability over other devices lacking this symmetric architecture. Accordingly, the characteristics or compositions of the three layers can be different than the specific embodiments disclosed herein.

Further, any color of emissive layer can be used in the stack, and the color is not limited to any specific color disclosed herein. For example, the stacks as shown in FIGS. 3C and 3D can contain top-middle-bottom layers having the following configuration of colors: red-green-red, green-red-green, blue-yellow-blue, yellow-blue-yellow, green-yellow-green, yellow-green-yellow, deep blue-light blue-deep blue, light blue-deep blue-light blue, yellow-red-yellow, or red-yellow-red, but any other colors can be used as would be understood by a person skilled in the art. Similarly, the color of light emitted from an OLED device including an emissive stack of the present invention can be any color, including, but not limited to: white light, red light, green light, yellow light, or blue light. Accordingly, any configuration of colors may be used in the stack as desired for the OLED device.

Figure 4:
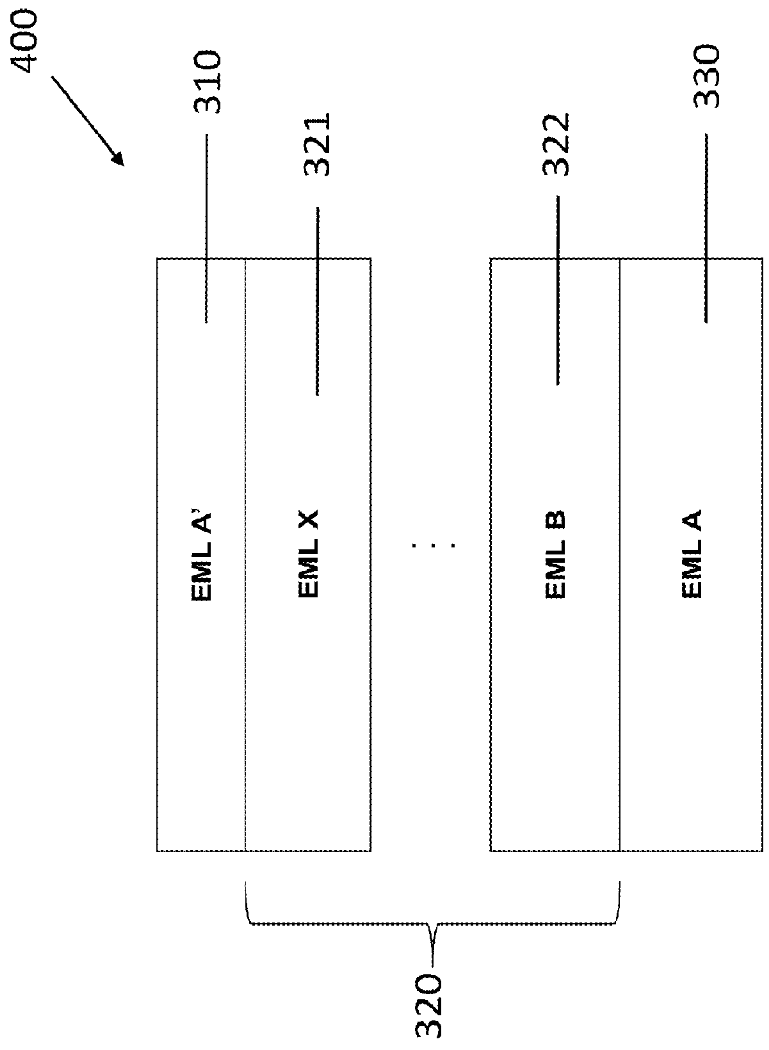
FIG. 4 shows an emissive layer stack with a bottom EML A, a top EML A' and two or more middle emissive layers in between (EML B through EML X). The EML A and EMLA' emit light in the same color region. At least one of the middle emissive layers emit light in a different color region than EML A and A'.

Referring now to FIG. 4, in one embodiment, stack 400 can include a middle emissive layer region 320 that comprises two or more middle emissive layers, such as middle emissive layers 321 and 322. Middle emissive layers 321, 322 and others can each emit light in the same color region or in a different color region, as compared to the other layers in middle emissive layer region 320. For example, middle emissive layer 321 can emit red light while middle emissive layer 322 emits green light. However, at least one middle emissive layer in middle emissive layer region 320 will emit light in a different color region than top (or first) emissive layer 310 and bottom (or Nth) emissive layer 320. Accordingly, it is contemplated that middle emissive layer region 320 as a whole will typically emit a different color light than top emissive layer 310 and bottom emissive layer 330. Further, only emissive layers are included in stack 400, i.e., non-emissive layers are not included between emissive layers 310, 320, and 330, or in between the respective middle emissive layers 321, 322. Middle emissive layer region 320 can include any number of middle emissive layers. In one embodiment, middle emissive layer region has two middle emissive layers. In other embodiments, middle emissive layer region can have 3, 4, 5, 6, 7, 8, 9, 10, or more middle emissive layers. Stack 400 can be used in any embodiment of an OLED device, as would be understood by a person skilled in the art. In one embodiment, stack 400 is an emissive stack, having N emissive layers, disposed between a first and second electrode in an OLED device, wherein the first (top) emissive layer is the emissive layer nearest the first electrode, the Nth (bottom) emissive layer is the emissive layer nearest the second electrode, and the stack has one or more middle emissive layers between the first and Nth emissive layers.

Figure 5:
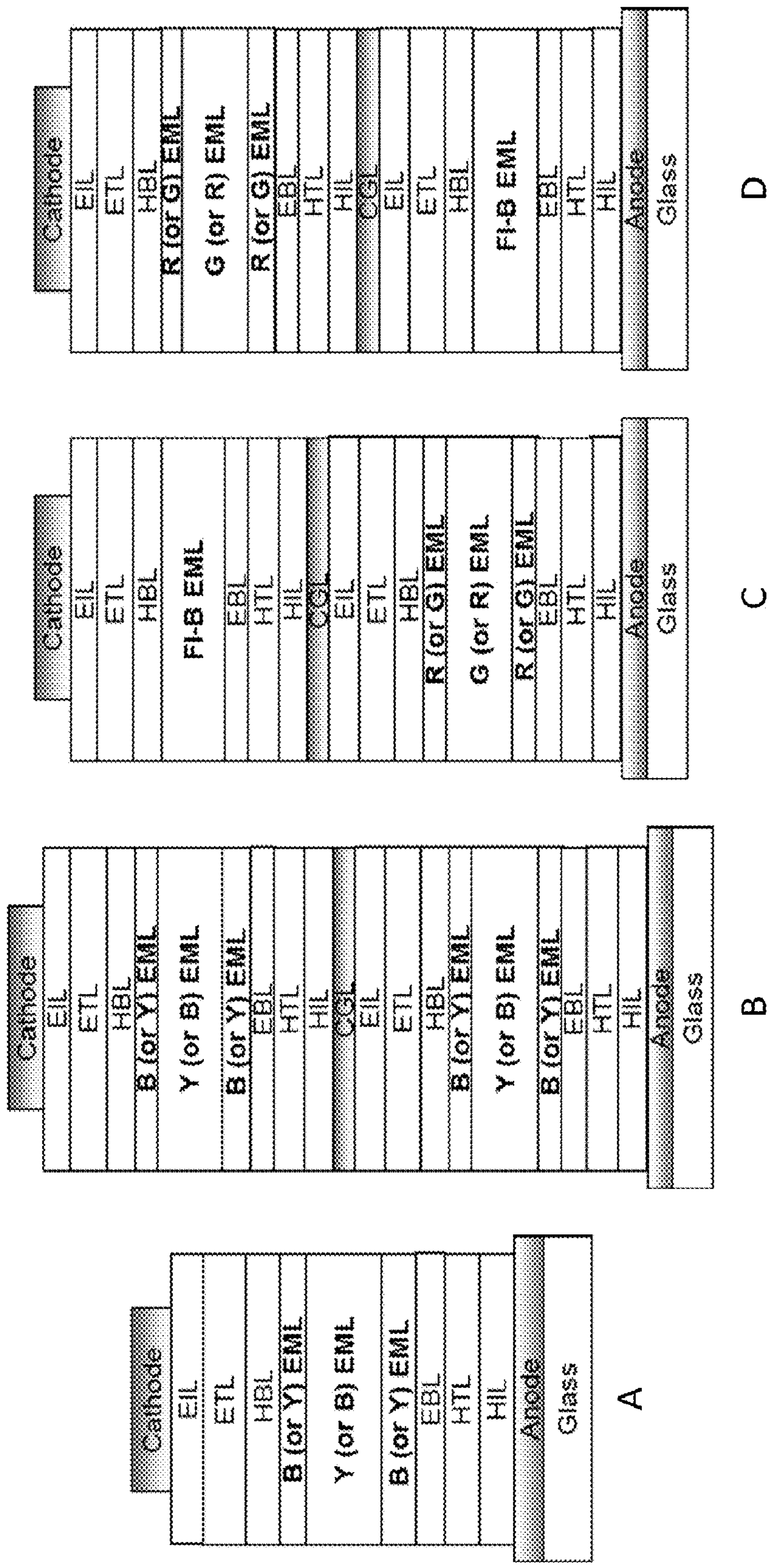
FIG. 5, comprising

Referring now to FIG. 5, a series of OLED architectures is shown. The OLED in FIG. 5A includes a single symmetric emissive stack, while the OLEDs in FIGS. 5B, 5C, and 5D include two emissive stacks, i.e., they are tandem devices. The OLED in FIG. 5B includes two symmetric emissive stacks. The OLED in FIGS. 5C and 5D include one symmetric emissive stack and a second stack that is a hybrid blue emissive stack (FI-B EML). As referred to herein, a hybrid blue emissive stack or layer is an emissive stack or layer that includes both fluorescent and phosphorescent blue dopants. Devices contemplated herein are not limited to having a single symmetric emissive stack, and can include devices having two or more symmetric emissive stacks. Further, a multi-stack device can include one or more stacks having the symmetric architecture as described herein, while also including one or more other types of stacks or emissive layers, i.e., other stack or emissive layers known in the art. In other words, the present invention is not limited to devices including only the symmetric-type emissive stacks described herein. In one embodiment, as shown in FIGS. 5B-5D, a device having two or more stacks can include a charge generation layer (CGL) between the two stacks. In one embodiment, the CGL layer can be in contact with either or both of the two stacks.

As previously mentioned, these symmetric emissive stacks exhibit significantly improved color stability over other types of stacks known in the art. For the purposes of this disclosure, the term "color-stable" refers generally to when an emissive stack does not exhibit a change in the color of light emitted from the stack after a period of use or after the stack is exposed to certain conditions. In one embodiment, the stacks exhibit better color stability compared to other known stacks when the driving current of a device including the stack is changed, i.e., increased or decreased. In one embodiment, the color of the stack is stable within a driving current density range of about 2 $mA/cm^2$ to about 80 $mA/cm^2$ or luminance changes from 800 $cd/m^2$ to 30,000 $cd/m^2$. If the 1931 CIE x and 1931 CIE y coordinates of the stack each change less than 0.02 within this current density or luminance range, preferably less than 0.01, and $\Delta uv=\sqrt{(\Delta u'^2+4v'^2)}$ is less than 0.02, preferably less than 0.01, more preferably less than 0.007, this is defined as a color stable stack at various current densities or luminance. Or, when current density changes from 10 $mA/cm^2$ to 50 $mA/cm^2$, or luminance changes from 4,000 $cd/m^2$ to 20,000 $cd/m^2$, if the 1931 CIE x and 1931 CIE y coordinates each changes less than 0.02, preferably less than 0.01, more preferably less than 0.007, and Δuv is less than 0.02, preferably less than 0.01, more preferably less than 0.007, this is defined as a color-stable stack at various current densities or luminance. Or, when current density changes from 10 $mA/cm^2$ to 20 $mA/cm^2$, or luminance changes from 4,000 $cd/m^2$ to 10,000 $cd/m^2$, if the 1931 CIE x and 1931 CIE y coordinates each change less than 0.02, preferably less than 0.01, more preferably less than 0.007, and Δuv is less than 0.02, preferably less than 0.01, more preferably less than 0.007, this is defined as a color-stable stack at various current densities or luminance. As referred to herein, Δuv refers to the minimum distance in the CIE 1976 (L*, u*, v*) color space chromaticity diagram of the lighting device chromaticity from the blackbody curve. That is, Δuv is a measure of the difference in chromaticity between a lighting device and a blackbody radiator of equivalent correlated color temperature. This can be quantified in terms of Δuv=√

$(\Delta u'^2+\Delta v'^2)=\sqrt{((u1'-u2')^2+(v1'-v2')^2)}$, where (u1", v1") are the coordinates of the lighting device, and (u2', v2') are the coordinates of the blackbody curve at the minimum distance from the lighting device in the CIE 1976 (L', u*, v*) color space chromaticity diagram.

In another embodiment, the stacks exhibit improved color stability after aging, for example after a device including the stack is heated and/or exposed to light for a period of time. For example, when the stack is aged to 70% of its initial luminance (LT70), the Δuv is less than 0.007, it is color-stable during the aging process. Or, when the stack is aged to 90% of its initial luminance (LT90), the Δuv is less than 0.007, preferably less than 0.005, more preferably less than 0.003, it is color-stable during the aging process. Or, when the stack is aged to 95% of its initial luminance (LT95), the Δuv is less than 0.007, preferably less than 0.005, more preferably less than 0.003, it is color-stable during the aging process. The color of light emitted from a device or stack can be considered stable if there is no statistically significant change in the color characteristics over a period of time, as would be understood by a person skilled in the art.

EXPERIMENTAL

In a first example, an OLED device which includes three emissive layers that are adjacent to each other without any other layer in between was fabricated. The bottom emissive layer and the top emissive layer contain two similar colors. In such a case, when the device is optimized with achieved charge balance and recombination zone pinned down at the interface of the emissive layers, minimum color shift can be achieved during variation of driving conditions.

To compare the color stability of the example device of the present invention with OLED devices having two-later stack architectures, red and green emissive layers were applied into stacks and three structures were grown: RGR stack, RG stack, and GR stack. The RGR stack, RG stack, and GR stack devices had almost identical 1931 CIE color coordinates, as shown in Table 1. These devices also had similar architectures as shown in FIG. 3, but with slight variation in layer thickness and doping concentrations. The RGR stack is comparable to the three-layer symmetric stack of FIG. 3C. The other two stacks are reference stacks comparable to the schematics of FIGS. 3A and 3B.

TABLE 1

Color variation data of an unaged device in RG stack, GR stack and RGR stack when driving current density varies from 2 $mA/cm^2$ to 80 $mA/cm^2$.

| | RG | | | GR | | | RGR | | |
|---|---|---|---|---|---|---|---|---|---|
| J | Luminance | 1931 CIE | | Luminance | 1931 CIE | | Luminance | 1931 CIE | |
| [$mA/cm^2$] | [$cd/m^2$] | x | y | [$cd/m^2$] | x | y | [$cd/m^2$] | x | y |
| 2 | 1,190 | 0.421 | 0.548 | 844 | 0.497 | 0.484 | 1,190 | 0.446 | 0.531 |
| 5 | 2,780 | 0.434 | 0.536 | 2,200 | 0.466 | 0.511 | 2,940 | 0.444 | 0.533 |
| 10 | 5,190 | 0.443 | 0.529 | 4,460 | 0.447 | 0.528 | 5,720 | 0.444 | 0.533 |
| 20 | 9,620 | 0.448 | 0.524 | 9,040 | 0.424 | 0.548 | 11,000 | 0.444 | 0.533 |
| 50 | 21,400 | 0.451 | 0.522 | 22,500 | 0.403 | 0.566 | 25,400 | 0.443 | 0.534 |
| 80 | 31,800 | 0.450 | 0.522 | 35,100 | 0.394 | 0.574 | 38,300 | 0.441 | 0.536 |
| ΔCIE (80 vs. 2 $mA/cm^2$) | — | 0.029 | 0.026 | — | 0.103 | 0.090 | — | 0.005 | 0.005 |
| ΔCIE (50 vs. 10 $mA/cm^2$) | — | 0.008 | 0.007 | — | 0.044 | 0.038 | — | 0.001 | 0.001 |
| Δuv (80 vs. 2 $mA/cm^2$) | 0.022 | | | 0.055 | | | 0.002 | | |
| Δuv (50 vs. 10 $mA/cm^2$) | 0.007 | | | 0.033 | | | 0.001 | | |

As previously described, in one embodiment, an OLED device can include additional emissive stacks of a type other than the symmetric emissive stacks described herein. In such an embodiment, it is contemplated that the one or more symmetric emissive stacks will exhibit the color stabilizing effects of the architecture described herein, while the other stack types may exhibit lower color stability. Accordingly, such a device, taken as a whole, may not be "color-stable" as defined herein, as a result of the potential lack of color stability in the other stack types.

It is contemplated herein that each emissive layer in a stack comprises one or more emissive dopants and one or more host materials. In one embodiment, identical dopants can be used in the first (top) and third (bottom) emissive layers so that the two layers emit the same color light. However, in another embodiment, the top and bottom layers can emit light in the same color region even if different dopants are used in these layers, and the stack can still show improved color-stability over other stacks in the art as a result of the architecture described herein.

All devices were fabricated in high vacuum (>$10^{-7}$ Torr) by thermal evaporation. The anode electrode was ~800 Å of indium tin oxide (ITO). The cathode consisted of 10 Å of Liq as electron injection layer (EIL) followed by 1,000 Å of Al. All devices were encapsulated with a glass lid sealed with an epoxy resin in a nitrogen glove box <1 ppm of $H_2O$ and $O_2$) immediately after fabrication, and a moisture getter was incorporated inside the package. The RGR stack device example had organic stacks consisting of, sequentially, from the ITO surface, 100 Å of LG101 (purchased from LG Chem) as the hole injection layer (HIL), 550 Å of Compound A as the hole transporting layer (HTL), 50 Å of Compound B as the electron blocking layer (EBL), three emissive layers (EML) and followed by 75 Å Compound C as the hole blocking layer and 350 Å of co-deposited Liq:LG201 (purchased from LG Chem) as the electron transporting layers (ETL). The RGR stack contains 25 Å of Red emissive layer (EML) with Compound C as host and 24% Compound D as a co-host and 1% Compound E as red emitter, 250 Å of Green EML with Compound F as host and 15% Compound G as green emitter, and a third 25 Å Red EML with Compound C as host and 24% Compound D as a co-host and 1% Compound E as red emitter. To achieve essentially the same color in the RG and GR stacks as the RGR stack, the RG stack and GR stack were fabricated with slight variations in thickness and doping concentrations. The RG stack contained 25 Å of Red emissive layer (EML) with Compound C as host and 24% Compound D as a co-host and 2% Compound E as red emitter and 250 Å of Green EML with Compound F as host and 10% Compound G as green emitter. The GR stack contained 250 Å of Green EML with Compound F as host and 26% Compound G as green emitter, and a third 25 Å Red EML with Compound C as host and 24% Compound D as a co-host and 2% Compound E as red emitter.

The compounds used in fabricating the devices have the following structures:

Compound A

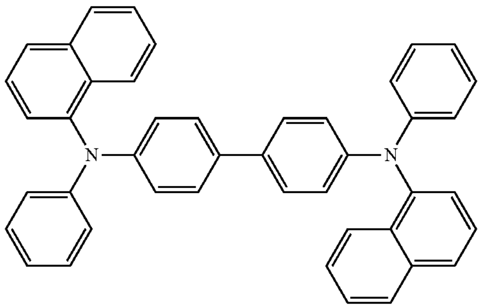

Compound B

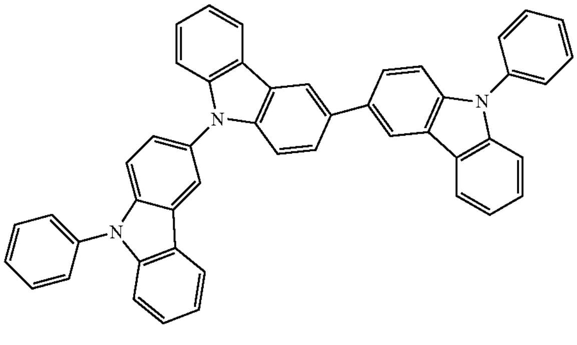

Compound C

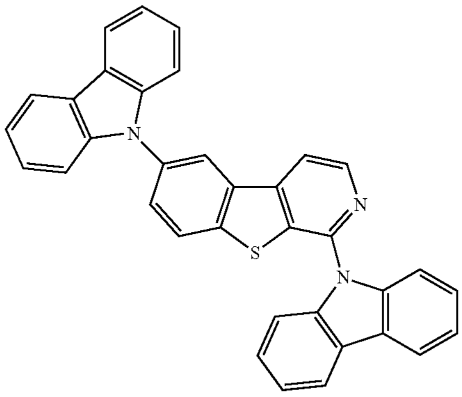

-continued

Compound D

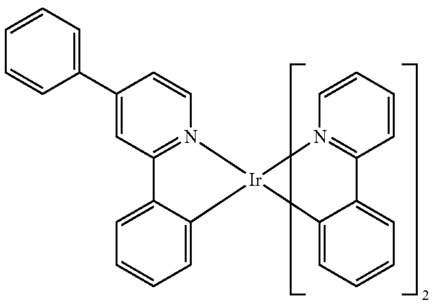

Compound E

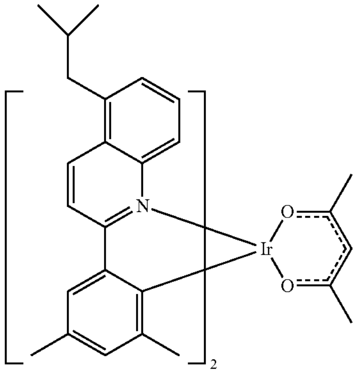

Compound F

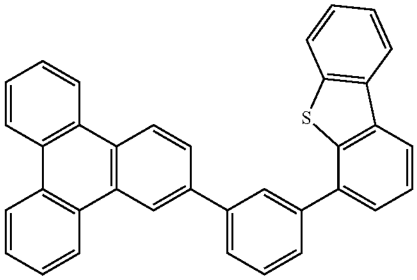

Compound G

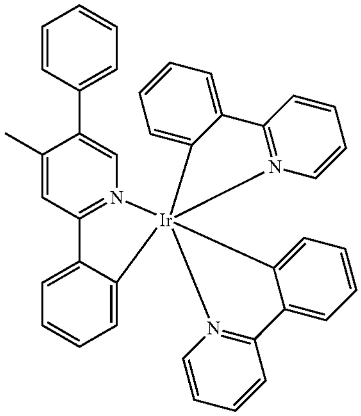

Figure 6A:
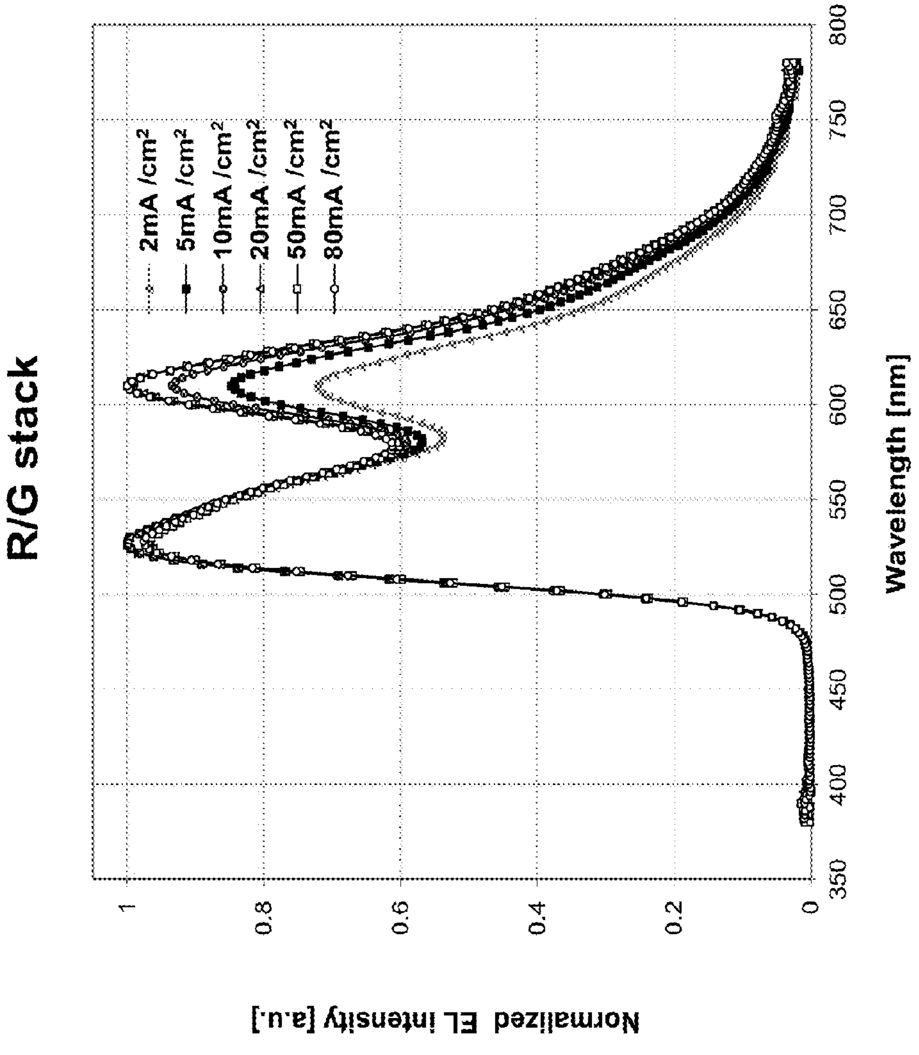
FIGS. 6A through 6C, shows normalized EL spectra data of an unaged device when current density varies from 1 $mA/cm^2$ to 80 $mA/cm^2$ for the reference OLED device having an RG stack (FIG. 6A); the reference device having a GR stack (FIG. 6B); and the OLED device according to an embodiment of the present invention having an RGR stack (FIG. 6C).
Figure 6B:
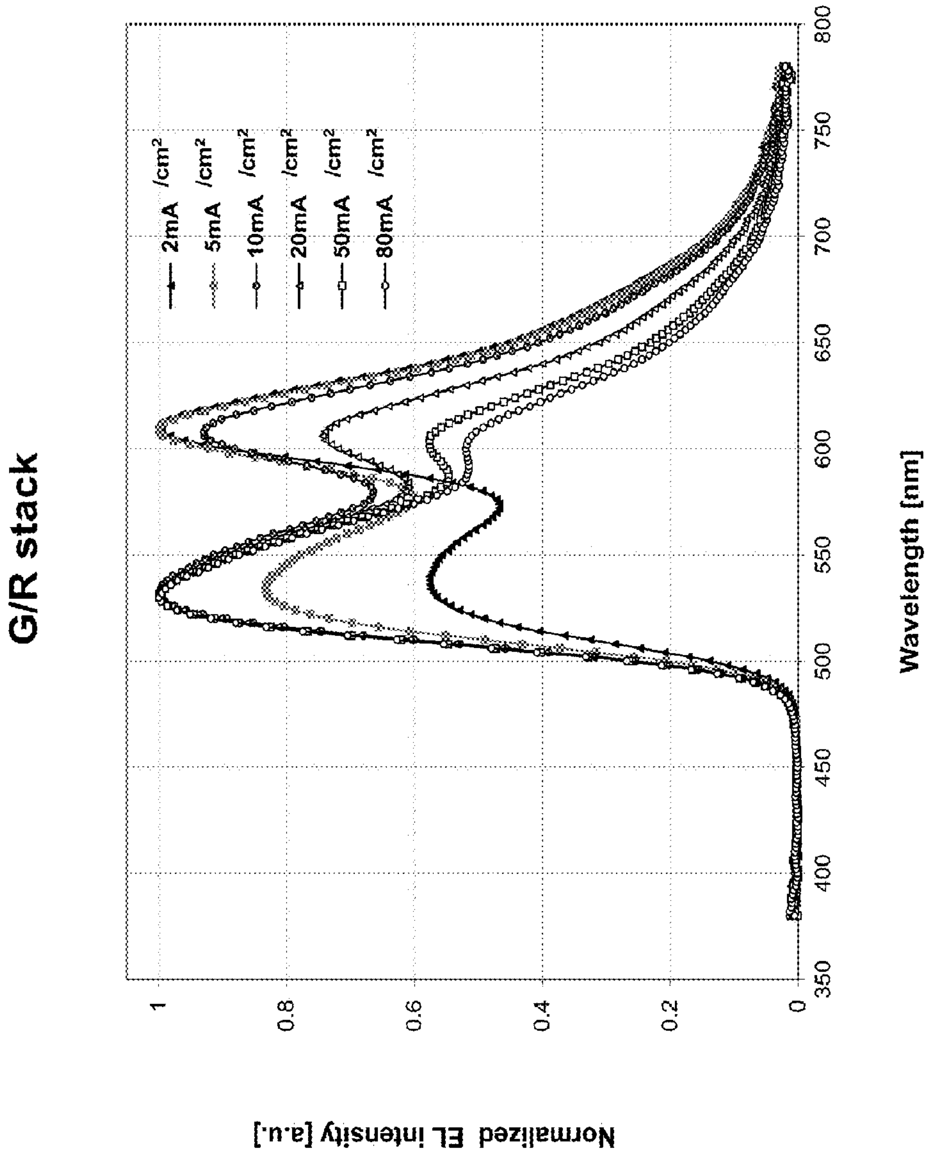
Figure 6C:
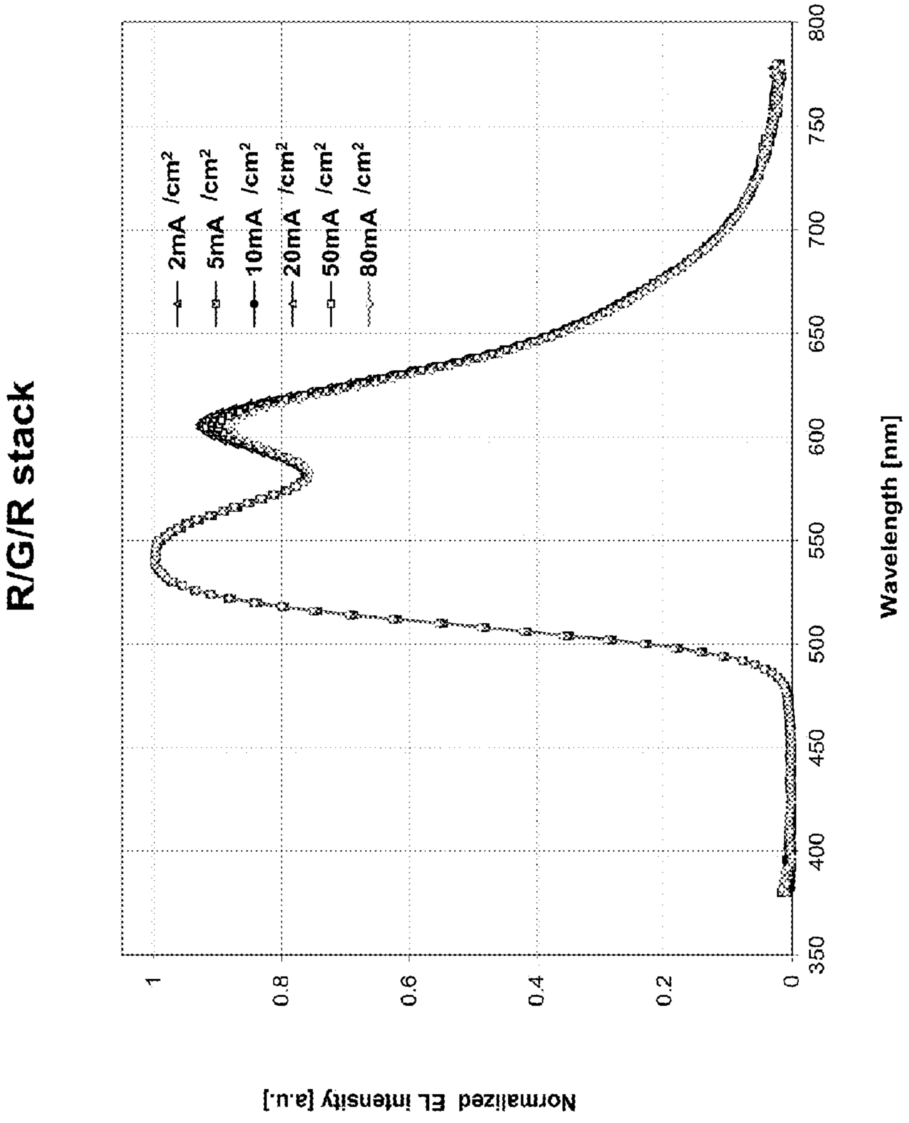

To evaluate the color stability of these three devices, the EL spectra were measured at various current inputs. FIG. 6 shows EL spectra data when current density varies from 2 $mA/cm^2$ to 80 $mA/cm^2$ for RG stack device (FIG. 6A), GR stack device (FIG. 6B) and RGR stack device (FIG. 6C). The 1931 CIE coordinates at each current density/luminance are listed in Table 1. The change in 1931 CIE (x, y) coordinates over the large range of luminance were calculated. The $\Delta uv=\sqrt{(\Delta u'^2+\Delta v'^2)}$ color difference between at 80 mA/cm$^2$ and 1 mA/cm$^2$ on the CIE 1976 (u', v') diagram were also calculated.

Figure 7A:
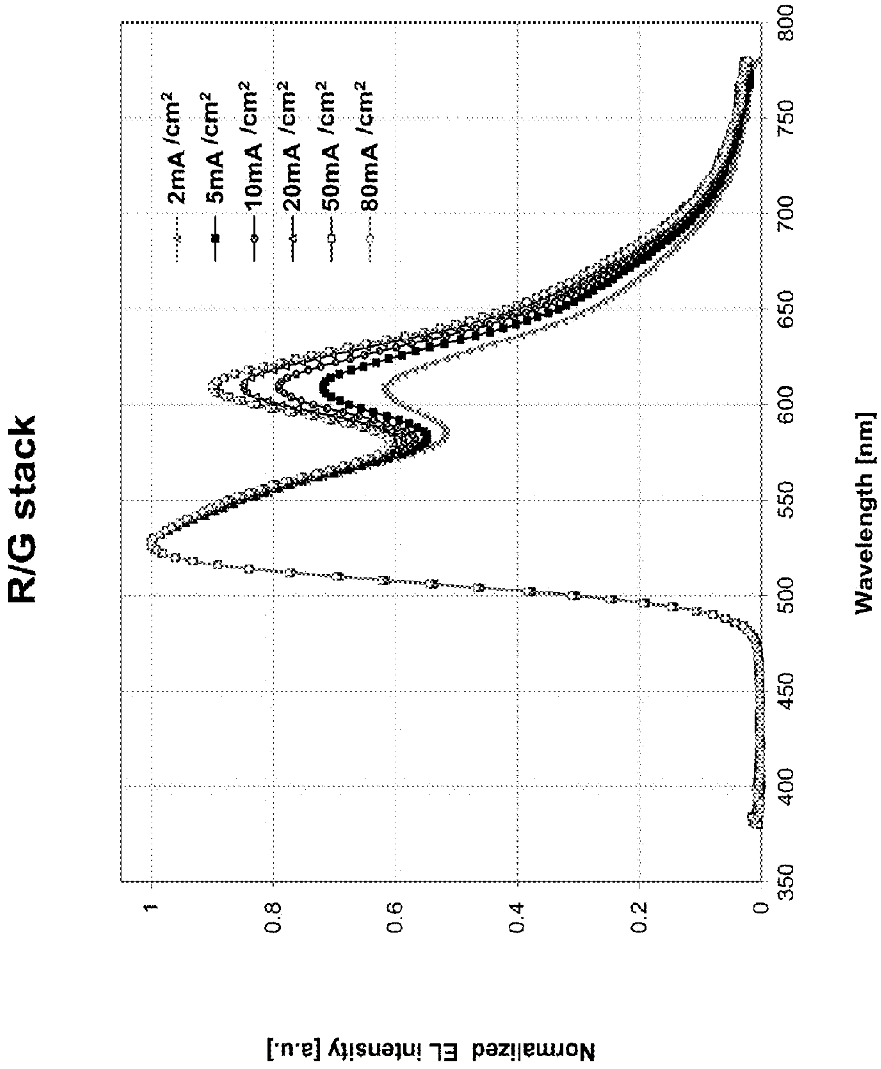
FIGS. 7A through 7C, shows normalized EL spectra data of an aged device when current density varies from 1 $mA/cm^2$ to 80 $mA/cm^2$ in the reference OLED having an RG stack (FIG. 7A); the reference device having a GR stack (FIG. 7B); and the OLED device according to an embodiment of the present invention having an RGR stack (FIG. 7C).
Figure 7B:
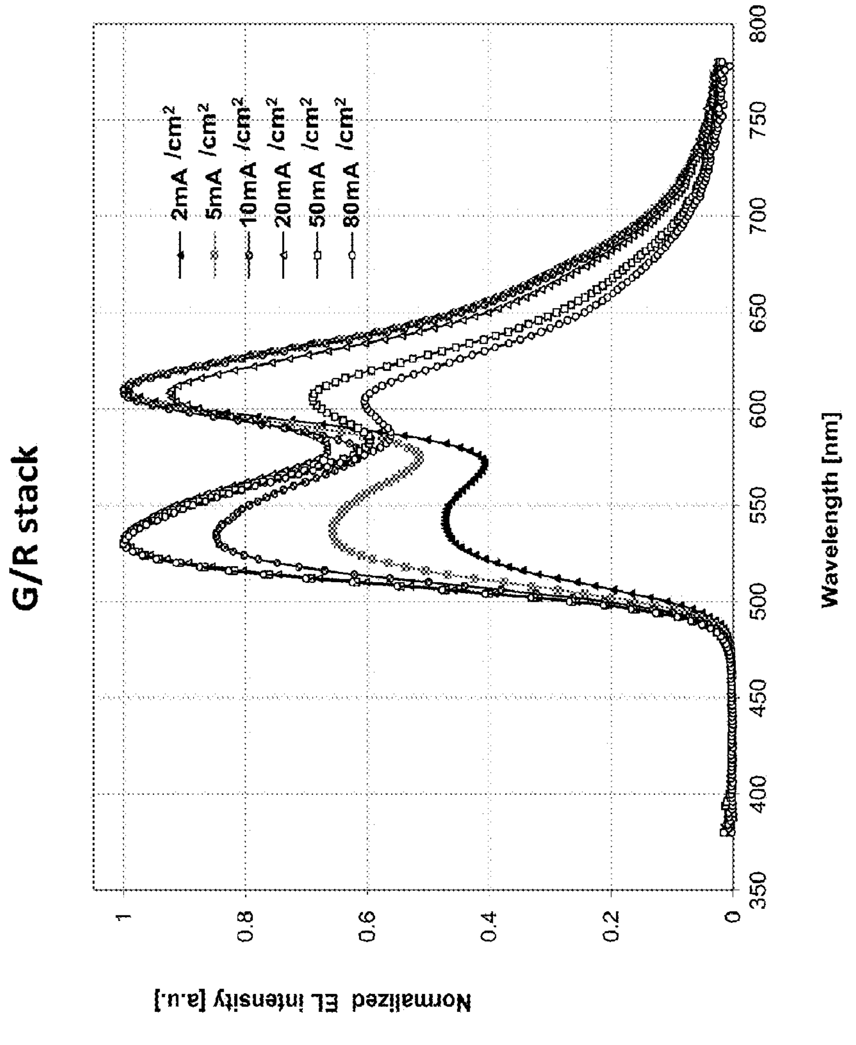
Figure 7C:
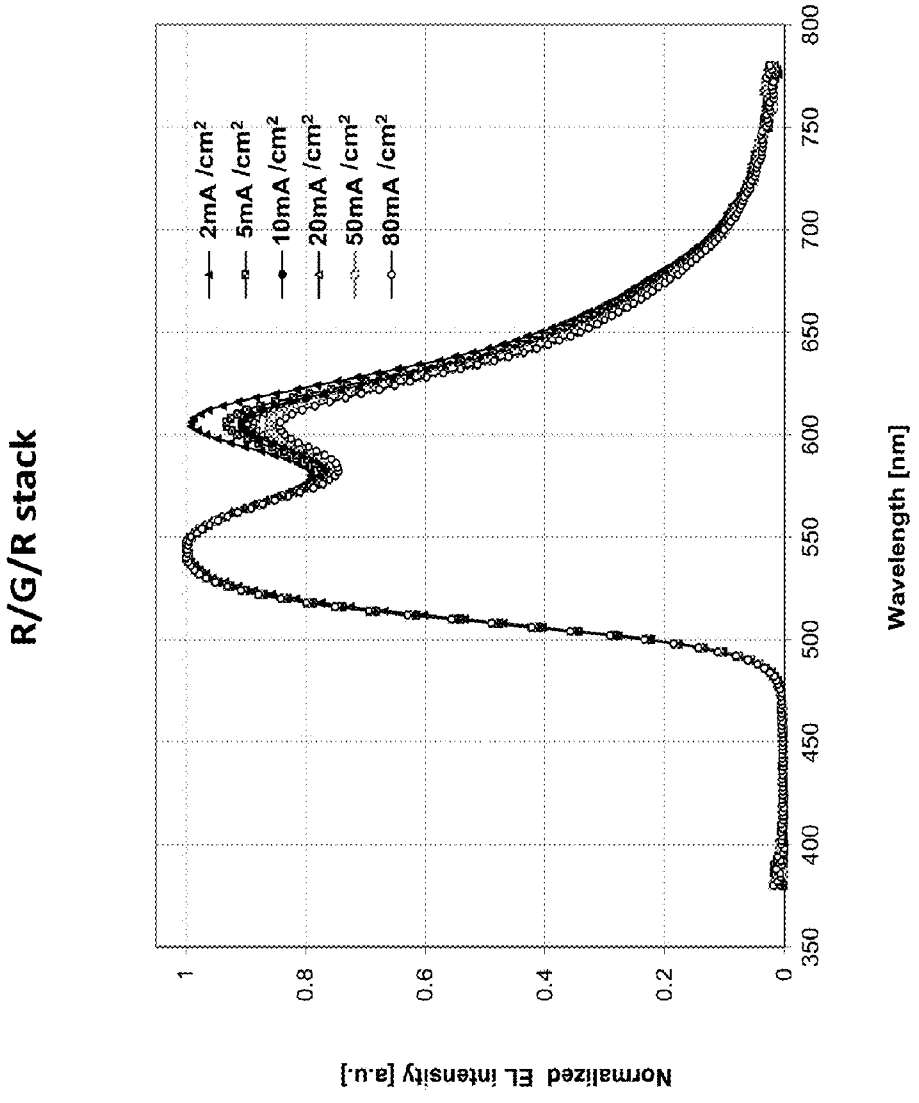

All three devices were then aged at a constant current of 80 mA/cm$^2$ at room temperature, and EL spectra were measured again at various current inputs. FIG. 7 shows the EL spectra data when current density varies from 2 mA/cm$^2$ to 80 mA/cm$^2$ for RG stack device (FIG. 7A), GR stack device (FIG. 7B) and RGR stack device (FIG. 7C). Table 2 shows the 1931 CIE coordinates at each current density/luminance of the aged devices.

TABLE 2

Color variation data of an aged device in RG stack, GR stack and RGR stack when driving current density from 2 mA/cm$^2$ to 80 mA/cm$^2$.

| | RG | | | GR | | | RGR | | |
|---|---|---|---|---|---|---|---|---|---|
| J | Luminance | 1931 CIE | | Luminance | 1931 CIE | | Luminance | 1931 CIE | |
| [mA/cm$^2$] | [cd/m$^2$] | x | y | [cd/m$^2$] | x | y | [cd/m$^2$] | x | y |
| 2 | 948 | 0.407 | 0.560 | 569 | 0.516 | 0.468 | 857 | 0.453 | 0.526 |
| 5 | 2,220 | 0.420 | 0.548 | 1,540 | 0.488 | 0.493 | 2,160 | 0.447 | 0.531 |
| 10 | 4,200 | 0.428 | 0.541 | 3,210 | 0.465 | 0.512 | 4,250 | 0.444 | 0.533 |
| 20 | 7,820 | 0.434 | 0.536 | 6,560 | 0.444 | 0.530 | 8,340 | 0.442 | 0.534 |
| 50 | 17,600 | 0.439 | 0.532 | 16,600 | 0.419 | 0.552 | 19,800 | 0.440 | 0.537 |
| 80 | 26,500 | 0.439 | 0.532 | 26,400 | 0.407 | 0.563 | 30,300 | 0.438 | 0.538 |
| ΔCIE (80 vs. 2 mA/cm$^2$) | — | 0.032 | 0.028 | — | 0.109 | 0.095 | — | 0.015 | 0.012 |
| ΔCIE (50 vs. 10 mA/cm$^2$) | — | 0.011 | 0.009 | — | 0.046 | 0.040 | — | 0.004 | 0.004 |
| Δuv (80 vs. 2 mA/cm$^2$) | 0.023 | | | 0.090 | | | 0.011 | | |
| Δuv (50 vs. 10 mA/cm$^2$) | 0.008 | | | 0.036 | | | 0.004 | | |

The color shift during aging for the devices was also compared. The unaged device data compared with aged device data of RG, GR and RGR devices is shown in Table 3.

TABLE 3

Color shift data during aging process of RG stack, GR stack and RGR stack when driving current density is at 10 mA/cm$^2$.

| | RG 1976 CIE | | GR 1976 CIE | | RGR 1976 CIE | |
|---|---|---|---|---|---|---|
| J = 10 mA/cm$^2$ | u' | v' | u' | v' | u' | v' |
| Before aging | 0.209 | 0.375 | 0.212 | 0.375 | 0.209 | 0.376 |
| After aging | 0.198 | 0.376 | 0.227 | 0.374 | 0.209 | 0.376 |
| Δuv | 0.011 (aged to LT81) | | 0.015 (aged to LT72) | | 0.000 (aged to LT74) | |

When input current densities vary from 2 mA/cm$^2$ to 80 mA/cm$^2$, the 1931 coordinates of CIE (x, y) of all three structures change accordingly. However, no matter whether the device is an aged device or an unaged device, the variation in 1931 CIE coordinates of the RGR stack is the minimum compared with the two reference stacks. When converted to 1976 color coordinates, the Δuv value of the RGR stack that quantifies the color difference between 1 mA/cm$^2$ and 80 mA/cm$^2$ was also the minimum among the three device architectures. The color stability during aging of RGR stack was also superior to the other two reference structures.

While not wishing to be bound by theory, this superior color stability of the example device at various luminance levels is due to the symmetric device architecture of the emissive layer in the three-layer stack architecture. When the driving current/electrical field is small, the recombination zone is closer to the ETL side due to the hole-transporting host environment. When the current/field is increased, more electrons are transported towards the HTL side, thus the recombination zone is broadened and moves towards HTL side. Specifically, for the RG stack, the color is red shifted at a higher driving current while the color is green shifted at a higher current for a GR stack. For an RGR stack, the recombination zone is shifted from the GR interface towards the RG interface when the current/field is increased. Since the two red EMLs have similar emissions, the overall emission of the RGR stack stays quite stable with various driving currents/applied fields. If the device is designed with a more electron-dominating host system, the recombination zone shift may be towards the opposite direction when current/field is increased. However, the color stability of RGR will likely still be the best among all the architectures analyzed in this experimental due to the symmetric design. A similar mechanism can be applied to X-Y-X stack such as BYB for a white stack.

On the other hand, since the Green and Red EMLs are adjacent to each other, there will be energy transfer from G to R EML which has an impact on both color stability during various driving currents and during the aging process. In an RG stack, for example, the recombination zone is close to ETL side at a low driving current. When the current is increased, the recombination zone gets broader and shifts to the HTL side and becomes closer to the RG interface, thus enhances the energy transfer from Green to Red. Therefore, the energy transfer was impacted more significantly in RG and GR stacks. In the RGR stack, the recombination zone shifts from one interface to another, so the energy transfer at various driving conditions are similar which also leads to better color stability. This can also apply to color stability during aging. The recombination zone can shift during the aging process. In an RGR stack, it is more likely to have better energy transfer throughout the entire aging process due to the symmetric architecture which will lead to Green and Red aging at the same rate. Therefore, the color stability during aging of a RGR stack is also better and a RG stack and a GR stack. The same mechanism can also be applied to other X-Y-X symmetric architectures.

More generally, it has been found that it may be desirable for at least one of the middle emissive layers in the emissive stack to have a thickness that is greater than the first emissive layer. For example, the RGR stack disclosed above includes 25 Å red EML layers surrounding a 250 Å green EML, resulting in a thickness 10 difference of a factor of 10 of these layers. More generally, it may be desirable in various embodiments for at least one middle emissive layer to have a thickness that is 2-10 times or more the thickness of the first and/or the Nth emissive layers where the emissive stack includes N (typically 3 or more) emissive layers. For example, an emissive stack may include first and/or Nth emissive layers having a thickness of T, and at least one middle emissive layer disposed between the first and Nth emissive layers having a thickness of 2T, 3T, 4T, 5T, 6T, 7T, 8T, 9T, 10T, or more, or any intervening relative thickness.

TABLE 5

Device example R/G/R' Red EML thickness variation

| Device Example | EML R1 [Å] | EML G2 [Å] | EML R3 [Å] | G2/R1 ratio | G2/R3 ratio |
|---|---|---|---|---|---|
| Example 4 | 150 | 300 | 150 | 2:1 | 2:1 |
| Example 5 | 150 | 300 | 60 | 2:1 | 5:1 |
| Example 6 | 150 | 300 | 30 | 2:1 | 10:1 |
| Example 7 | 60 | 300 | 150 | 5:1 | 2:1 |
| Example 8 | 60 | 300 | 60 | 5:1 | 5:1 |
| Example 9 | 60 | 300 | 30 | 5:1 | 10:1 |
| Example 10 | 30 | 300 | 150 | 10:1 | 2:1 |
| Example 11 | 30 | 300 | 60 | 10:1 | 5:1 |
| Example 12 | 30 | 300 | 30 | 10:1 | 10:1 |

TABLE 6

Device performance and color stability for Red EML thickness variation

| Device | At 1 mA/cm$^2$ | | | | At 10 mA/cm$^2$ | | | | At 100 mA/cm$^2$ | | | | 100 to 1 |
|---|---|---|---|---|---|---|---|---|---|---|---|---|---|
| | 1931 CIE | | 1976 | | 1931 CIE | | 1976 | | 1931 CIE | | 1976 | | mA/cm$^2$ |
| Example | x | y | u' | v' | x | y | u' | v' | x | y | u' | v' | ¯u'v' |
| Example 4 | 0.461 | 0.515 | 0.223 | 0.561 | 0.463 | 0.513 | 0.225 | 0.561 | 0.470 | 0.506 | 0.470 | 0.506 | 0.0084 |
| Example 5 | 0.450 | 0.524 | 0.215 | 0.562 | 0.453 | 0.520 | 0.217 | 0.562 | 0.462 | 0.512 | 0.462 | 0.512 | 0.0100 |
| Example 6 | 0.446 | 0.527 | 0.211 | 0.562 | 0.450 | 0.523 | 0.215 | 0.562 | 0.459 | 0.514 | 0.459 | 0.514 | 0.0113 |
| Example 7 | 0.450 | 0.525 | 0.214 | 0.562 | 0.448 | 0.526 | 0.213 | 0.562 | 0.449 | 0.525 | 0.449 | 0.525 | 0.0008 |
| Example 8 | 0.440 | 0.532 | 0.207 | 0.563 | 0.439 | 0.532 | 0.206 | 0.563 | 0.439 | 0.530 | 0.439 | 0.530 | 0.0004 |
| Example 9 | 0.437 | 0.534 | 0.205 | 0.563 | 0.436 | 0.534 | 0.204 | 0.563 | 0.437 | 0.532 | 0.437 | 0.532 | 0.0006 |
| Example 10 | 0.441 | 0.532 | 0.207 | 0.563 | 0.437 | 0.535 | 0.204 | 0.564 | 0.432 | 0.539 | 0.432 | 0.539 | 0.0063 |
| Example 11 | 0.431 | 0.539 | 0.200 | 0.564 | 0.427 | 0.542 | 0.198 | 0.564 | 0.422 | 0.545 | 0.422 | 0.545 | 0.0061 |
| Example 12 | 0.428 | 0.541 | 0.198 | 0.564 | 0.424 | 0.544 | 0.195 | 0.564 | 0.419 | 0.547 | 0.419 | 0.547 | 0.0061 |

To further determine and define the effect of emissive layer thickness on device stability, additional experiments were performed for a general device structure with EMLs of the form X/Y/X' as previously disclosed. The ratio of the thicknesses of the EML Y to X was varied as 2:1, 5:1, 10:1 and the ratio of the thicknesses of the EML Y to X' was varied as 2:1, 5:1, 10:1 Example Red/Green/Red devices were fabricated according to the device fabrication protocol and device materials described above. The device general structure is shown in Table 4.

TABLE 4

Device layer materials and thicknesses for the red EML thickness variation

| Layer | Material | Thickness [Å] |
|---|---|---|
| Anode | ITO | 750 |
| HIL | HATCN | 100 |
| HTL | HTM | 400 |
| EML R1 | EH:HH1 (2:1):RDD 2.5% | x |
| EML G2 | HH2:EH1 (3:2):GD2 10% | 300 |
| EML R3 | EH1:RDS 2.5% | Y |
| ETL | Liq:ETM (2:1) | 300 |
| EIL | Liq | 10 |
| Cathode | Al | 1000 |

Device layer thicknesses are shown in Table 5 and device performance (CIE and color stability vs luminance variation) are shown in the Table 6.

Figure 8:
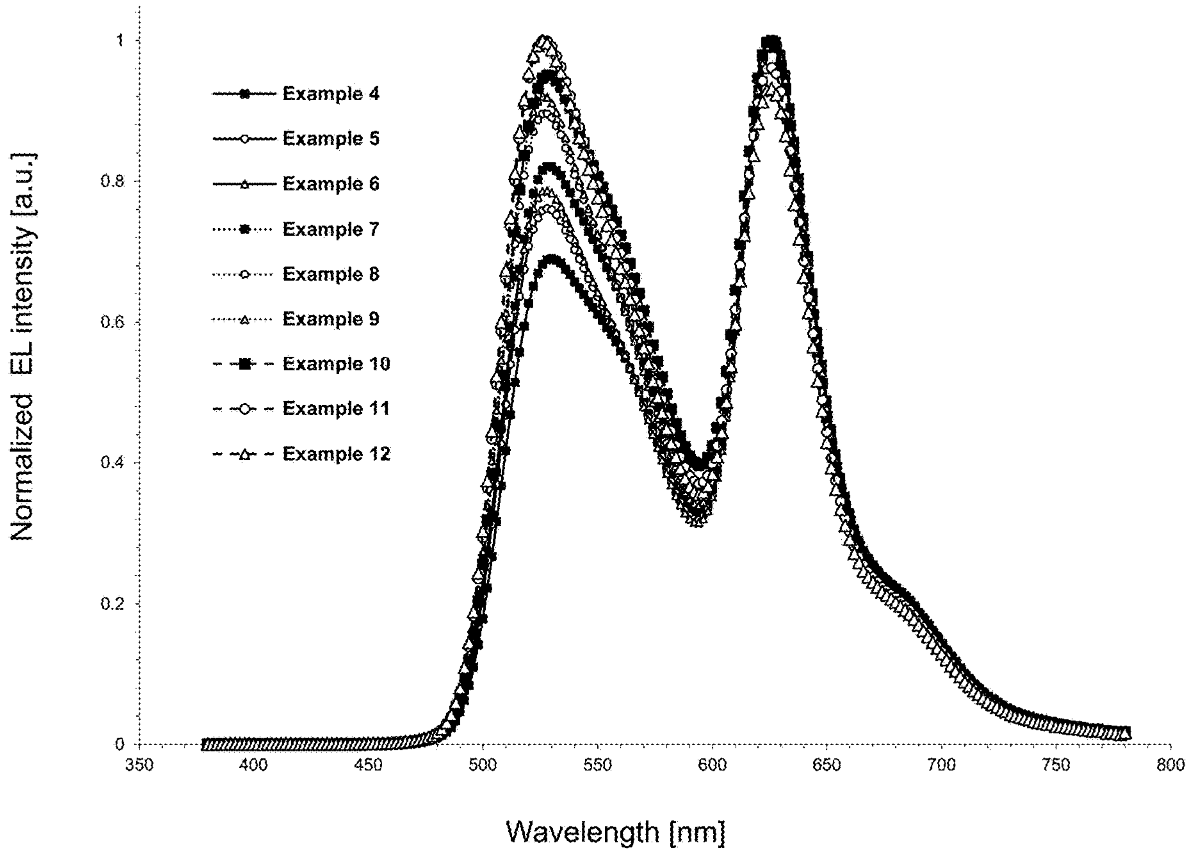
FIG. 8 shows examples of electroluminescent spectra for devices having varying EML thicknesses.

EL spectra of the experimental device examples 4 to 12 are shown in FIG. 8

As seen from the data in Table 6, the color stability toward current density is strongly dependent on the thicknesses of the green and both red layers. So, the ratio of the thickness of green and red EMLs may be used to tune the color stability of R/G/R' devices as previously disclosed. Typically, a thinner EML R1 provides a better color stability of the device, and the additional red emission is compensated by contribution of the emission from the EML R3 and red/green emission ratio in this device may be tuned the same as in thicker R1 red EML device (as shown by the EL spectra in FIG. 8). The examples shown here have different red emitters RDD and RDS in R1 and R3 EML layers, but more generally embodiments disclosed herein are not limited to different emitters in the two layers and alternatively or in addition may include the same emitters in R1 and R3 EMLs.

It has also been found that the position of different emitters, such as red emissive materials, which have the same or different CIE but different HOMO levels may affect the color stability of the device. This may be particularly true for R1 or R3 emissive layers in a RGR structure as disclosed herein, especially for particularly red/green peaks ratio as a function of driving current. Accordingly, in some embodiments one or more emissive materials can be selected to have similar (or different) CIE values but different energy levels to achieve a desired color range and stability.

Several examples of color-stable, multi EML structures are disclosed herein.

Schematic HOMO-LUMO level diagrams of several such examples are shown in FIGS. 9, 10, 11, 12, and 13. The energy levels and functions of the materials which can be used to build color stable multi EML structures are shown in Table 7.

TABLE 7

HOMO and LUMO levels of the EML materials for color stable multicolor devices

| Material | HOMO [eV] | LUMO [eV] | Description |
|---|---|---|---|
| RH 1-1 | 5.96 | 2.74 | Red E-host deeper HOMO |
| RH 1-2 | 5.06 | 2.11 | Red H-host |
| RH 1-3 | 5.64 | 2.73 | Red E-host shallower HOMO |
| RH 3 | 5.43 | 2.88 | Single red host |
| GH 2-1 | 5.96 | 2.16 | Green H-host wide BG |
| GH 2-2 | 5.96 | 2.74 | Green E-host |
| GD2 | 5.08 | 2.15 | Green Emitter |
| RDd | 5.32 | 2.81 | Deep HOMO red emitter |
| RDs | 5.07 | 2.51 | Shallow HOMO red emitter |

The abbreviations in the tables and figures of these examples of three EML R/G/R structures with various color stability toward luminance refer to the following:

EML 1—Red EML close to HTL (also called R EML)

EML 2—Green EML in the middle

EML 3—Red EML close to ETL (also called R' EML)

Hosts in the device EMLs may be single hosts or may include more than one component (typically hole transporter and electron transporter components)

RH 1-1 $1^{st}$ component or Red host in EML1

RH 1-2 $2^{nd}$ component or Red host in EML1

RH-1-3 1st component of Red host with shallower HOMO in EML1

RH-1 single red host in red EML 1

GH 2-1 $1^{st}$ component or Green host in EML2

GH 2-2 $2^{nd}$ component or Green host in EML2

RH 3-1 $1^{st}$ component or Red host in EML3

RH 3-2 $2^{nd}$ component or Red host in EML3

RH3—single red host in Red EML 3

RDs—shallow HOMO red emitter with HOMO shallower than −5.2 eV

RDd—deep HOMO red emitter with HOMO deeper than −5.2 eV

GD2—green emitter

In these examples, a "deep HOMO" red emitter refers to a HOMO deeper than −5.2 eV, while a "shallow HOMO" red emitter refers to a HOMO shallower than −5.2 eV.

Figure 9:
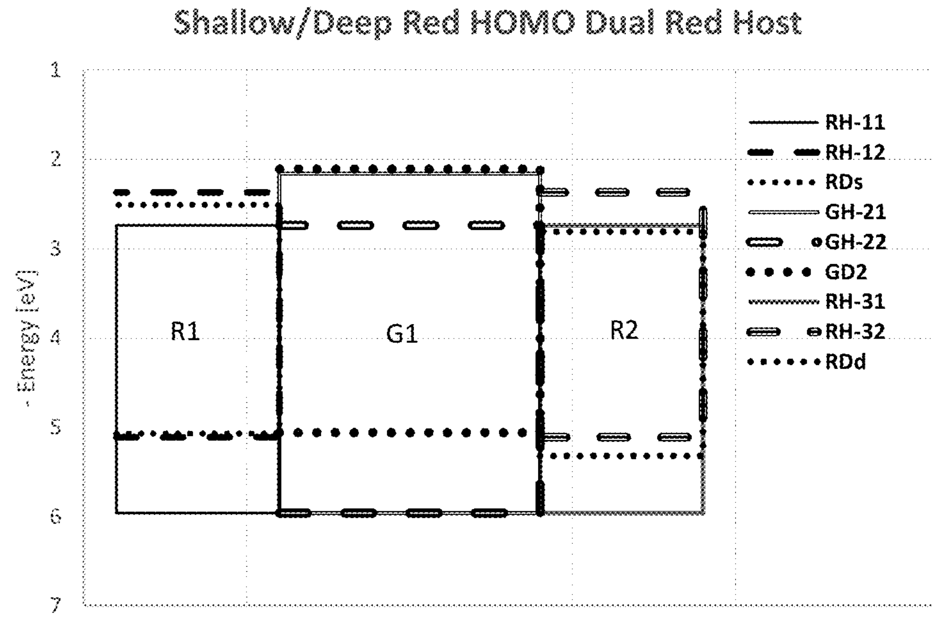
FIG. 9 shows a device having an R/G/R structure with R1 shallow HOMO red (RDs) and R3 deep HOMO red (RDd) emitters. In this RDs/G/RDd device configuration the holes are free to move all the way until EML 3 where they are then trapped by the RDd deep Red emitter, allowing the configuration to be used to tune color stability.
Figure 11:
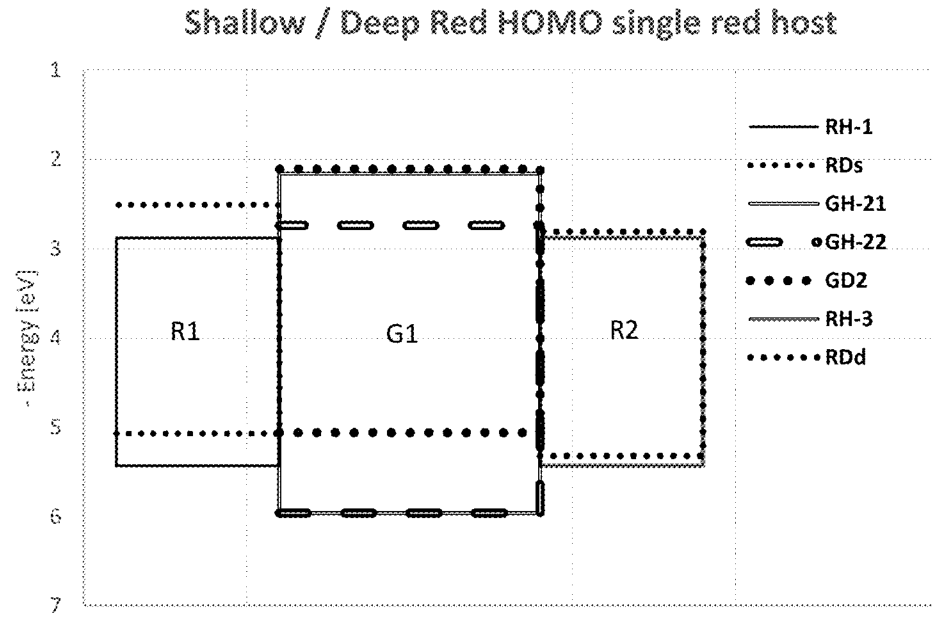
FIG. 11 shows an example R/G/R device structure with R1 shallow HOMO red (RDs) and R3 deep HOMO red (RDd) emitters. In the RDs/G/RDd device configuration the holes are free to move through to EML 3 where they are then trapped by the deep Red emitter (RDd). This configuration can be used to tune color stability.

In an embodiment, if a shallow HOMO red emitter (RDs) is positioned in the red EML R (close to the HTL) and a deep HOMO red emitter (RDd) is positioned in the red EML R' (close to the ETL), then the HOMO configuration may be more favorable for hole transport via red EML R (closer to the HTL), green EML and hole blocking in red EML R' (next to the ETL). In the example RDs/G/RDd device configuration shown, the holes are free to move all the way to the red EML R' next to the ETL, where they are then blocked by the RDd deep red emitter. Such a configuration may be used to tune the color stability. The schematic energy level diagram of the device with this configuration is shown in FIGS. 9 and 11. Differences between the examples are due to differences in the host materials in the red EMLs (e.g., dual host vs single host).

In an embodiment, a deep HOMO red emitter (RDd) is positioned in the red EML R (close to the HTL) and a shallow HOMO red emitter (RDs) is positioned in the red EML R' (close to the ETL). Such a configuration may provide a HOMO level arrangement that may be more favorable for the holes impeded by the RDd in the first EML. Upon leaving the EML R (closer to the HTL), the holes may move freely through EML2 and EML3 (closer to the ETL). Accordingly, this configuration also may be used to tune the color stability of the device.

Figure 10:
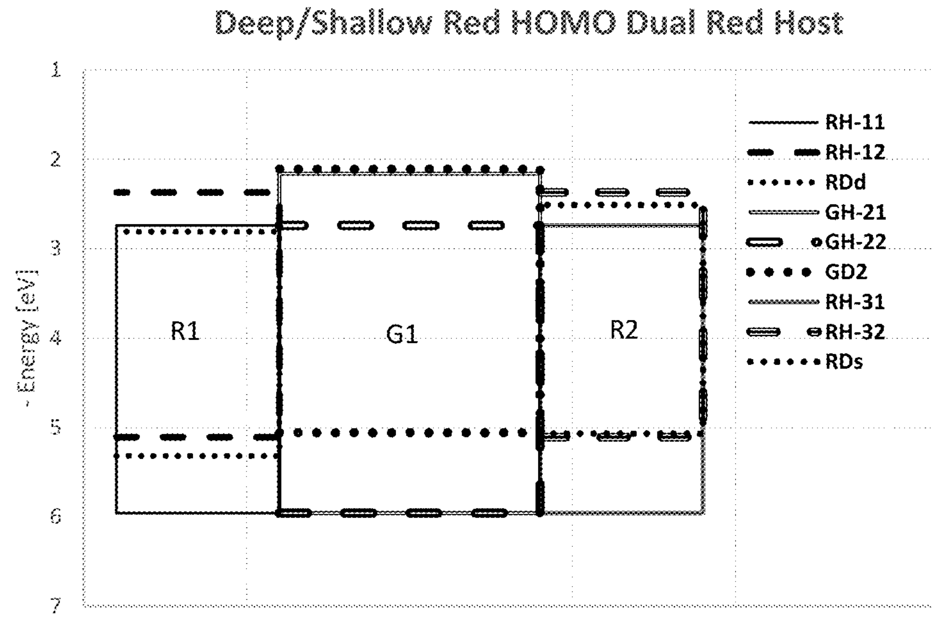
FIG. 10 shows an example R/G/R device structure with R1 deep HOMO red (RDd) and R3 shallow HOMO red (RDs) emitters. In this RDd/G/RDs device configuration the holes are impeded by RD in the first EML. Upon leaving EML1 holes are free to move all the way through EML2 and EML 3. This configuration can be used to tune color stability.
Figure 12:
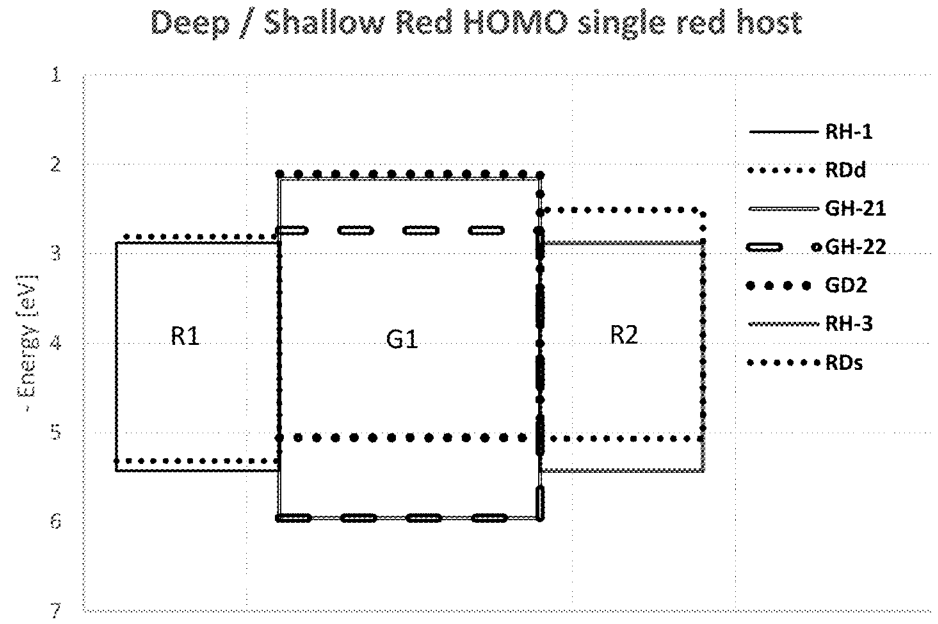
FIG. 12 shows an example R/G/R structure with R1 shallow HOMO red (RDd) and R3 shallow HOMO red (RDs) emitters. In this RDd/G/RDs device configuration the holes are impeded by RD in the first EML. Upon leaving EML1 holes are free to move through EML2 and EML 3. This configuration can be used to tune color stability.

The schematic energy level diagram of a device with such a configuration is shown in FIGS. 10 and 12. The differences between examples are due to different host materials in the Red EMLs (e.g., dual host vs. single host).

If the HOMO and LUMO levels of the host molecules are dominantly charge transporting, then the difference in HOMO and LUMO between adjacent layers may be used for design of the color-stable structures by selecting the EML configuration to "lock" the charge within one or two EMLs to prevent recombination zone migration with the current flowing through the device. This may provide a barrier to hole injection from shallower to deeper HOMO charge transport materials and then prevents spreading of the recombination zone with luminance increase, thereby providing a mechanism to tune the color stability of the device in terms of the ratio of R/G emissive peaks.

Figure 13:
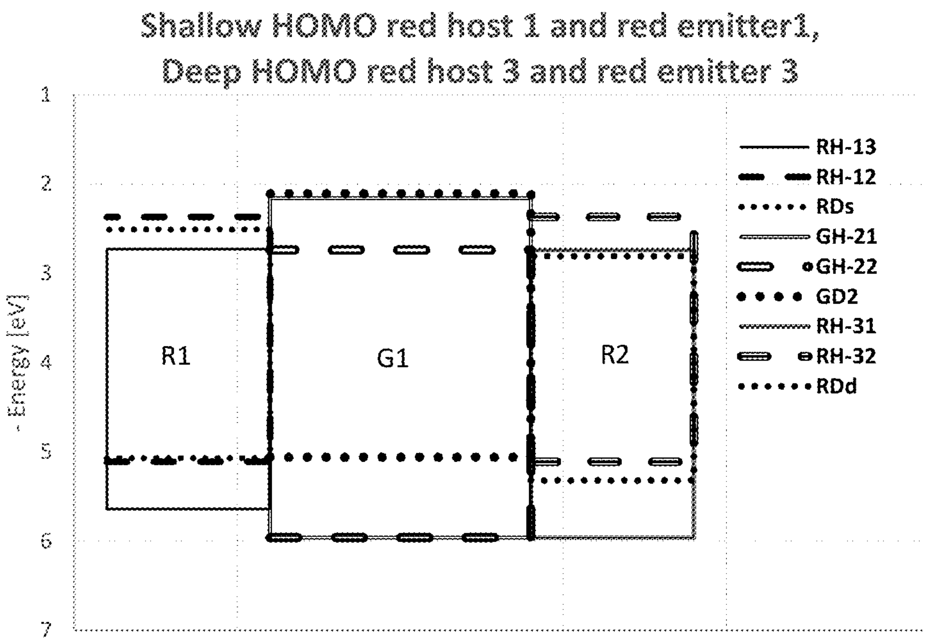
FIG. 13 shows an example R/G/R device structure having an R1 shallow HOMO red emitter with shallow HOMO red host, and an R3 deep HOMO red emitter with deep HOMO red host. This configuration can be used to tune color stability.

As previously disclosed, a device as disclosed herein may have an EML structure having a R/G/R' arrangement, which includes various hosts in R (red EML closer to the HTL) and R' (red EML closer to the ETL). This may be understood as a specific example of the more generalized X/Y/X' structures disclosed herein. In an embodiment, the host in the R red EML (closer to the HTL) may be selected to have a shallower HOMO to provide hole transport, while the R' host (red EML closer to the ETL) may be selected to have a deeper HOMO to block the holes from going through this EML. Such a configuration may be favorable for color stability tuning and may be used in combination with red emitters having the same or different HOMO levels. It has been found that in some embodiments the most favorable structure is for the R EML (red EML next to the HTL) to include a shallow HOMO host and a shallow HOMO emitter, and the R' EML (red EML next to the ETL) to use a deep HOMO host and a deep HOMO emitter. The schematic energy level diagram of such a device is shown in FIG. 13.

In an embodiment, the concentration of hole transporting cohost in the R red EML (close to the HTL) and the R' red EML (close to the ETL) may be different. For example, it may be desirable for the R red EML (close to HTL) to have a higher concentration so as to provide hole transport through the R red EML (next to HTL) and the green EML(s). Similarly, in the R' red EML (close to the ETL) the concentration of hole transporting cohost may be lower so as to prevent hole transport through this EML, thereby preventing migration of the recombination zone and providing greater control of color stability of the device.

More generally, considering the various embodiments and arrangements previously disclosed herein, it is possible to use host variation, host composition, emitter energy levels in R Red EML (next to HTL) and R' Red EML (next to ETL) in any combination to change the charge transport through the EML(s), and thereby tune the color stability of the device toward driving current and aging.

Furthermore, although the previously-disclosed examples and the experimental data provided herein use R/G/R' structures for illustration and ease of understanding, embodiments disclosed herein are not limited to red and green emissive materials or layers. The scope and content of embodiments disclosed herein are not limited to only R/G/R-type structures, but rather include various other arrangements using two colors of emissive layers but which may have structural, compositional, or energy level differences between emissive layers of the same color. That is, embodiments disclosed herein more generally relate to X/Y/X' structures, where X and Y may represent different colors including red, green, blue, yellow, or other colors. Y and X may be similar colors but using different emitter and host materials, or they may be different colors. Similarly, X and Y may have similar or different HOMO-LUMO levels. The Y emissive layer may contain more than one EML. Although the X and X' layers may have emission spectra in the same color, they may not have identical emission spectra. For example, the layers may have emission spectra that include peak wavelengths within 1 nm, 2 nm, 5 nm, 10 nm or any intervening value of one another. Similarly, the peak wavelengths may be farther apart, although still within the range of a same color for the X and X' layers.

In an embodiment, an OLED as disclosed herein may include an emissive layer having an X/Y/X' structure. The X EML emitter HOMO may be deeper than the X' EML emitter HOMO. Specifically, it may be desirable for the X EML emissive material HOMO to be 0.1, 0.2, or 0.3 eV deeper than the X' EML emissive material HOMO. Alternatively or in addition, the X emitter LUMO may be deeper than the X' EML emitter LUMO, specifically 0.1, 0.2, or 0.3 eV deeper. In some embodiments, X and X' may be red EMLs as previously disclosed.

Alternatively, or in addition, in an embodiment the X/Y/X' structure may include X and X' EML host materials in which the X host HOMO is shallower than the X' host HOMO. For example, the X EML host HOMO may be 0.1, 0.2, 0.3, 0.4, or 0.5 eV shallower or more, preferably 0.1-0.3 eV shallower, than the HOMO of X' EML host. Alternatively, or in addition, the X EML host LUMO may be shallower than the X' EML host LUMO, specifically, 0.1, 0.2, 0.3, 0.4, or 0.5 eV shallower or more, preferably 0.1-0.3 eV shallower, than the X' EML host LUMO. In another embodiment, the X and X' host HOMO and/or LUMO may have the opposite relationship, i.e., the X' host HOMO and/or LUMO may be shallower than the corresponding X host HOMO and/or LUMO, specifically 0.1, 0.2, 0.3, 0.4, or 0.5 eV shallower or more, preferably 0.1-0.3 eV shallower.

In an embodiment the X/Y/X' structure may include materials in which the X EML includes an emitter having shallower HOMO and LUMO levels than the HOMO and LUMO levels in the X' emitter. For example, the X EML HOMO and/or LUMO levels may be 0.1, 0.2, 0.3, 0.4, or 0.5 eV shallower or more, preferably 0.1-0.3 eV shallower, than the corresponding HOMO and/or LUMO of the X' EML.

As previously disclosed, other attributes of an X/Y/X' structure as disclosed herein may be used to adjust the attributes of the device such as the color stability, such as the presence and/or relative concentration of host materials. Alternatively, or in addition to the features disclosed above, in an embodiment an X/Y/X' structure as disclosed herein may include an EML, such as a red EML, that contains dual host materials including hole transporting and electron transporting cohosts. The hole transporting cohost concentration in the X EML may be over 1.5×, 3×, 5×, 10×, or any intermediate ratio higher than the hole transporting cohost concertation in the X' EML. More generally, each of the X, Y, and X' EMLs may include one or more cohost materials, such as a hole transporting cohost material and/or an electron transporting cohost material. The relative concentration of these materials may be used to adjust attributes of the device, such as disclosed herein with reference to R and R' EMLs, for any combination of EMLs as disclosed herein.

Another factor that may be used to adjust attributes of the device is the relative thickness of the layers. Accordingly, alternatively or in addition to the features previously disclosed, in a X/Y/X' structure the X EML thickness may be 2×, 3×, 5×, 10× or more thinner than the thickness of the Y EML. Alternatively or in addition, the X' EML thickness may be 2×, 3×, 5×, 10×, or more thinner than the thickness of the Y EML. Alternatively or in addition, the X and X' EMLs may have same or different thicknesses.

Although the various EMLs and structures disclosed herein include separate, distinct layers, those layers may include similar or the same materials. For example, the X and X' EMLs may include one or more of the same materials, such as the same host material, the same or similar cohost materials, or an emissive material in one that serves as a co-host in the other. As a specific example, the X and X' EML host materials may be the same, with one or more different emitters in each EML. As another example, the emissive material in the Y EML may be used as a co-host in the X and/or X' EMLs, serving the appropriate function in each case. That is, in such arrangements, the same material may serve different functions in each layer.

Figure 14:
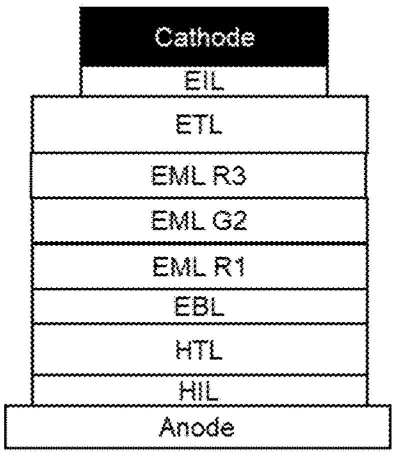
FIG. 14 shows an example device structure according to an embodiment disclosed herein.

To illustrate the various features disclosed herein, example devices were fabricated by high vacuum ($<10^{-7}$ Torr) thermal evaporation. The anode electrode was 750 Å Å of indium tin oxide (ITO). The cathode consisted of 10 Å of Liq as electron injection layer (EIL) followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. The organic stack of the device examples consisted of sequentially from the ITO surface, 100 Å of HATCN as the hole injection layer (HIL); 400 Å of HTM as a hole transporting layer (HTL); 50 Å of EBM as an electron blocking layer. Device contained 3 emissive layers R1/G2/R3. 100 Å of a red emissive layer R1 (EML R1) containing electron transporting host EH1 or EH2, hole transporting host HH1 in ratio (2:1) and red emitter RDS or RDD 2.5%, 350 Å of green emissive layer G2, containing hole transporting host HH2, electron transporting host EH1 in the ratio of (3:2) and green emitter GD2 10%, and 50 Å of third red EML R3, containing electron transporting host EH1 doped with red emitter RDS or RDD in the concertation 2.5%. 350 Å of Liq:ETM (2:1) layer was used as an electron transporting layer (ETL). FIG. 14 shows the schematic device structure. Table 8 shows the device layer thickness and materials.

TABLE 8

Example device layer materials and thicknesses

| Layer | Material | Thickness [Å] |
|---|---|---|
| Anode | ITO | 750 |
| HIL | HATCN | 100 |
| HTL | HTM | 400 |
| EML R1 | EH:HH1 (2:1):RD 2.5% | 100 |
| EML G2 | HH2:EH1 (3:2):GD2 10% | 350 |
| EML R3 | EH1:RD 2.5% | 50 |
| ETL | Liq:ETM (2:1) | 350 |
| EIL | Liq | 10 |
| Cathode | Al | 1000 |

The chemical structures of the device materials are shown below.
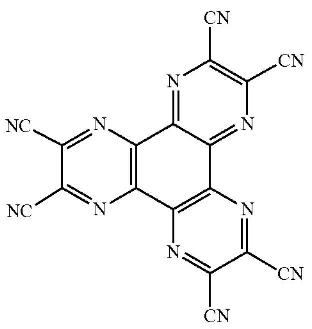
HATCN
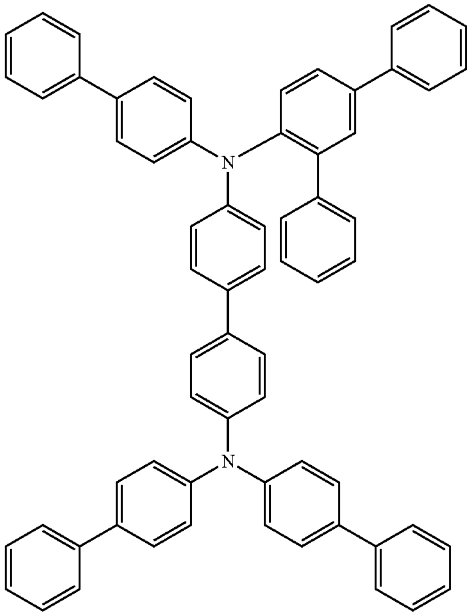
HTM
-continued
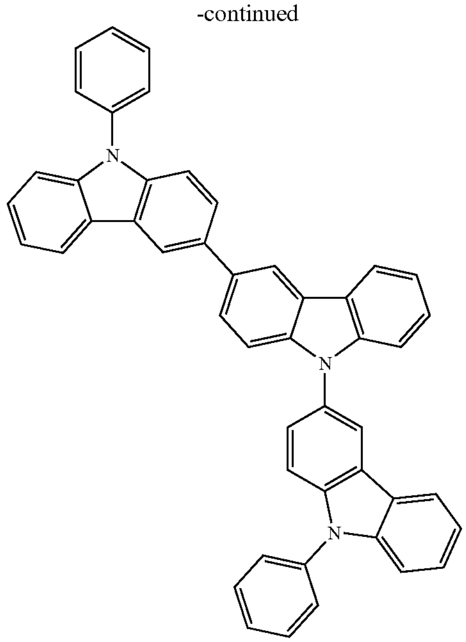
EBM
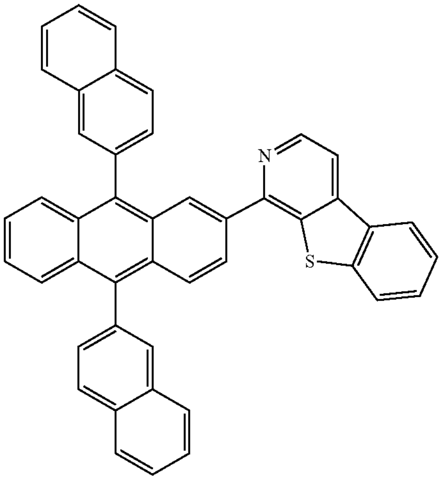
ETM
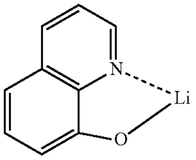
Liq -continued

EH1

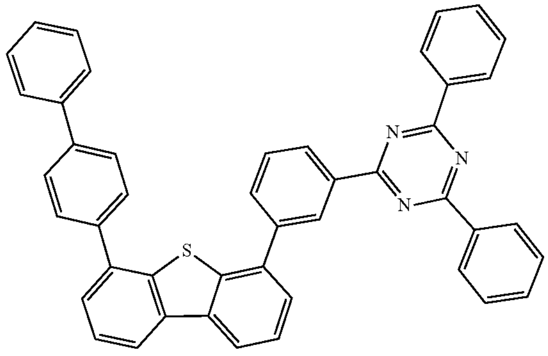

EH2

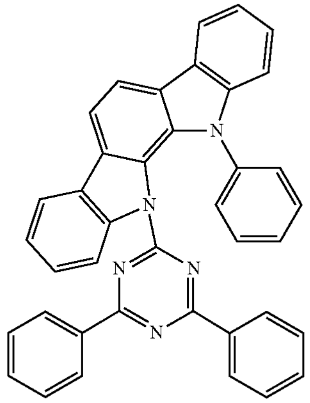

HH1

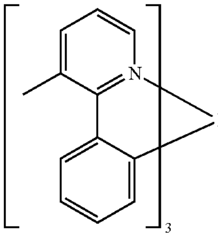

HH2

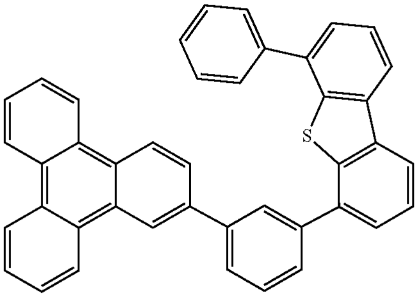

-continued

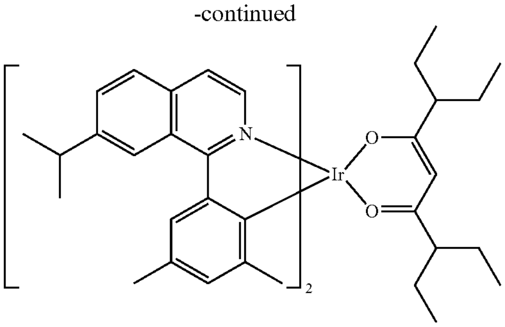

RDS

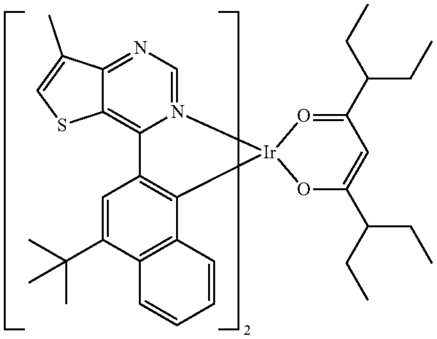

RDD

GD2

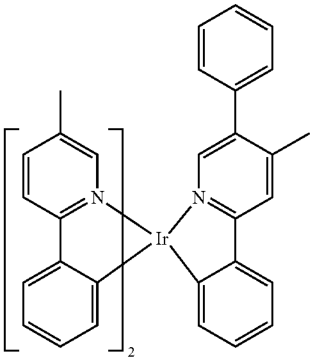

Upon fabrication the devices EL and JVL of the devices have been measured. In addition, EL spectra of the devices have been measured at multiple current density of 1 mA/cm$^2$, 10 mA/cm$^2$ and 100 mA/cm$^2$ to test the color stability with luminance variation.

Fabricated devices revealed dual peak red green emission. EL spectra of fabricated device examples measured at 10 mA/cm$^2$ are shown in FIG. 10. Due to recombination zone shift within device emissive layers with the luminance variation the ratio of the red and green peaks changed so the color coordinates 1931 CIE x,y or 1976 u'v' were changed as well. The less changes in device color coordinates the better device color stability. The color stability of each device was defined as a delta u'v' measured at 100 and 1 mA/cm$^2$.

$$\Delta(u'v')=\sqrt{(u-u')^2+(v-v')^2}$$

where u,v—1976 color coordinates of the EL are measured at 100 mA/cm$^2$ and u'v' 1976 color coordinates of the EL are measured at 1 mA/cm$^2$.

Figure 15:
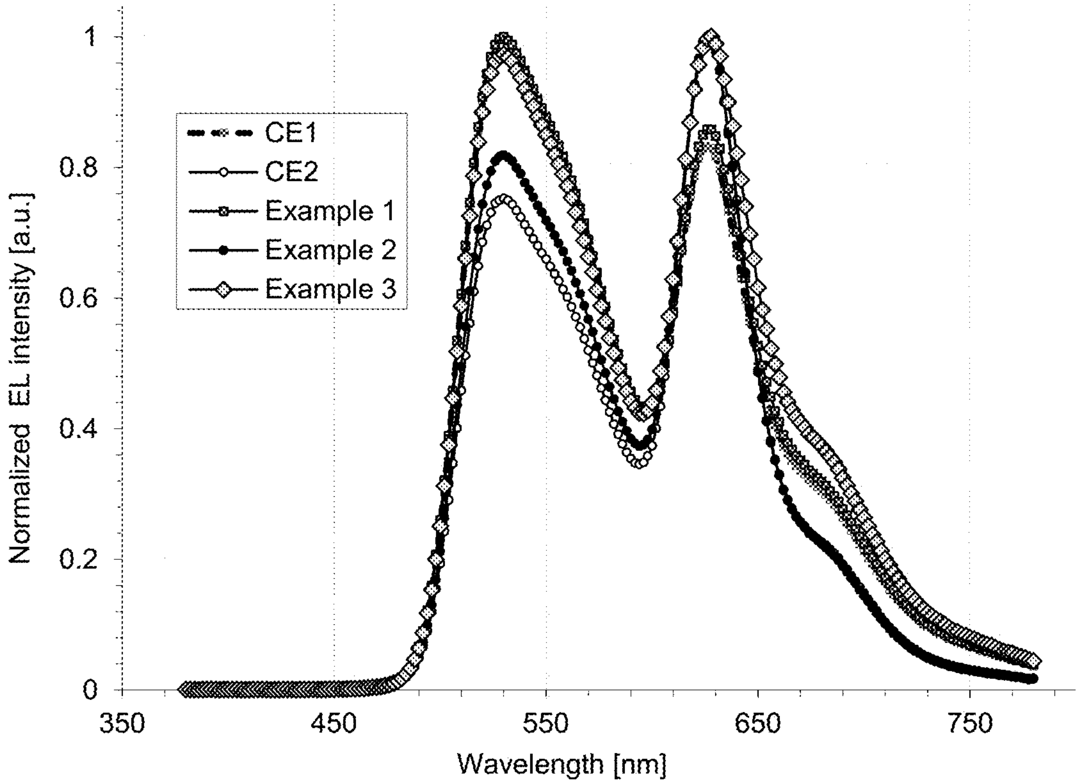
FIG. 15 shows normalized luminance of several comparative devices and devices fabricated according to embodiments disclosed herein.
Figure 16:
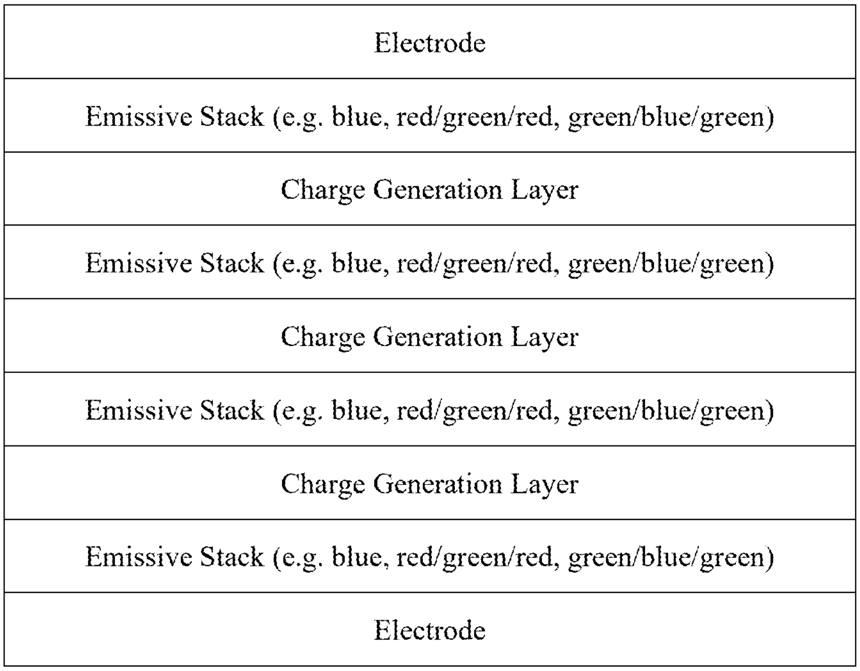
FIG. 16 shows an example of a device according to embodiments disclosed herein.
Figure 17:
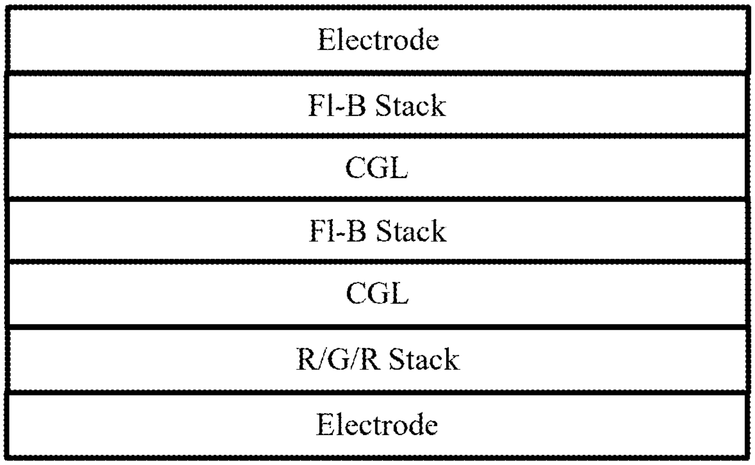
FIG. 17 shows an example of a device according to embodiments disclosed herein.

The device examples EML structures are shown in Table 9 and the device's color coordinates measured at multiple current densities and color stability data are summarized in Table 10. FIG. 15 shows normalized EL intensity for the devices.

TABLE 9

Example device R/G/R' Red EML compositions

| Device Example | EML R1 Host 1 | EML R1 Cohost 1 | EML R1 Red emitter 1 | EML R3 Host 2 | EML R3 Red Emitter 2 |
|---|---|---|---|---|---|
| CE1 | EH1 | HH1 | RD1 | EH1 | RD1 |
| CE2 | EH1 | HH1 | RD2 | EH1 | RD2 |
| Example 1 | EH1 | HH1 | RD1 | EH1 | RD2 |
| Example 2 | EH1 | HH1 | RD2 | EH1 | RD1 |
| Example 3 | EH2 | HH1 | RD1 | EH1 | RD2 |

TABLE 10

Example device performance and color stability

| Device | At 1 mA/cm$^2$ | | | | At 10 mA/cm$^2$ | | | | At 100 mA/cm$^2$ | | | | 100 to 1 |
|---|---|---|---|---|---|---|---|---|---|---|---|---|---|
| | 1931 CIE | | 1976 | | 1931 CIE | | 1976 | | 1931 CIE | | 1976 | | mA/cm$^2$ |
| Example | x | y | u' | v' | x | y | u' | v' | x | y | u' | v' | Δu'v' |
| CE1 | 0.421 | 0.551 | 0.192 | 0.565 | 0.426 | 0.546 | 0.196 | 0.565 | 0.437 | 0.536 | 0.204 | 0.564 | 0.0122 |
| CE2 | 0.449 | 0.526 | 0.213 | 0.563 | 0.456 | 0.519 | 0.219 | 0.562 | 0.465 | 0.510 | 0.227 | 0.560 | 0.0138 |
| Example 1 | 0.425 | 0.547 | 0.195 | 0.565 | 0.428 | 0.544 | 0.197 | 0.565 | 0.436 | 0.536 | 0.204 | 0.563 | 0.0090 |
| Example 2 | 0.446 | 0.529 | 0.211 | 0.563 | 0.450 | 0.525 | 0.214 | 0.562 | 0.458 | 0.517 | 0.221 | 0.561 | 0.0100 |
| Example 3 | 0.447 | 0.528 | 0.212 | 0.563 | 0.440 | 0.534 | 0.206 | 0.563 | 0.443 | 0.530 | 0.209 | 0.563 | 0.0024 |

As previously disclosed, to understand the device color stability in connection with charge transport via EMLs it is useful to consider the HOMO and LUMO energy levels of the materials. As used herein, unless indicated to the contrary the relevant energy levels of a layer or material were determined by solution cyclic voltammetry and differential pulsed voltammetry. Measurements were performed using a CH Instruments model 6201B potentiostat using anhydrous dimethylformamide solvent and tetrabutylammonium hexafluorophosphate as the supporting electrolyte. Glassy carbon, and platinum and silver wires were used as the working, counter and reference electrodes, respectively. Electrochemical potentials were referenced to an internal ferrocene-ferroceniumredox couple (Fc/Fc+) by measuring the peak potential differences from differential pulsed voltammetry. The corresponding highest occupied molecular orbital (HOMO) energy and the lowest unoccupied molecular orbital (LUMO) energy were determined by referencing the cationic and anionic redox potentials to ferrocene (4.8 eV vs. vacuum).

$$HOMO=-(CV\ ox)-4.8\ (eV)$$

$$LUMO=-(CV\ red)-4.8\ (eV)$$

Table 11 shows energy levels and functions in the device of the EML materials used in the device example experiments.

Two red emitters RDS and RDD with deep and shallow HOMO and LUMO levels were used in the experiments. Both emitters have similar color saturation however different energy levels (see Table 12). In the device red EMLs these two emitters demonstrated different charge transporting characteristics due to different HOMO and LUMO levels energy, which can be used for color stability tuning.

TABLE 11

Energy levels and functions of EML materials used in the device example experiments.

| Material | HOMO [eV] | LUMO [eV] | Description |
|---|---|---|---|
| EH1 | 5.96 | 2.74 | Red E-host deeper HOMO |
| HH1 | 5.06 | 2.11 | Red H-host |
| EH2 | 5.64 | 2.73 | Red E-host shallower HOMO |
| RDS | 5.07 | 2.51 | Shallow HOMO red emitter |
| RDD | 5.32 | 2.81 | Deep HOMO red emitter |
| HH2 | 5.96 | 2.16 | Green H-host wide BG |
| GD2 | 5.08 | 2.15 | Green emitter |

TABLE 12

EL spectral data and energy levels of red emitters RDS and RDD.

| Emitter | λ max [nm] | 1931 CIE x | 1931 CIE y | HOMO [eV] | LUMO [eV] | Description |
|---|---|---|---|---|---|---|
| RDS | 629 | 0.688 | 0.309 | 5.07 | 2.51 | Shallow HOMO red emitter |
| RDD | 628 | 0.685 | 0.314 | 5.32 | 2.81 | Deep HOMO red emitter |

Two red electron transporting hosts EH1 and EH2 with deep HOMO and Shallow HOMO (see Table 11) also possess different charge transport properties and were used to tune the color stability of R/G/R structures.

Five examples of the device structures were fabricated to demonstrate the difference in color stability due to device structure variation. Comparative examples CE1 and CE2 show structures with the same red emitters in both EMLs (EML R1 and EML R3). Example 1 and Example 2 shows structures with different red emitters RDS and RDD in EMLs R1 and R3. Example 3 shows in addition to different red emitters also different electron transporting hosts in the EMLS R1 and R3. Green EML was the same in all the structures.

Table 11 shows energy levels and functions in the device of the EML materials used in the device example experiments.

Experimental data is consistent with the charge transport explanations using device energy level diagrams provided herein (FIGS. 9, 11, 13). Referring again to Table 10, in a preferred configuration (Example 3) the shallow HOMO of the host and emitter in EML R1 facilitate hole transport through EML R1 to G2 and R3 and deep HOMO of host and emitter in EML R3 prevent further hole transport away from green EML G2, lock the recombination zone from migrating, and thus significantly improve color stability of R/G/R structures.

As previously disclosed, the relative thickness of various layers in an emissive layer structure may be used to tune device stability. Such configurations may be used in conjunction with any of the emitter and/or host HOMO/LUMO arrangements disclosed herein. For example, in a device having an X/Y/X' structure as disclosed herein, the middle emissive layer Y may have a thickness of 2-10 times the thickness of one or more of the X, X' outer emissive layers. In addition, the X, Y, and X' emissive layers may include emitters and/or hosts having any of the HOMO and/or LUMO relationships disclosed herein.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. An organic light emitting device, comprising:

a first electrode;

a first emissive layer disposed over the first electrode and comprising a first fluorescent blue emissive material;

a first charge generation layer disposed over the first emissive layer;

a second emissive layer disposed over the first charge generation layer and comprising a first red emissive material having a peak wavelength in the range 580-700 nm;

a third emissive layer disposed over the second emissive layer and comprising a first green emissive material;

a fourth emissive layer disposed over the third emissive layer and comprising a second red emissive material having a peak wavelength in the range 580-700 nm;

a second charge generation layer disposed over the fourth emissive layer; and a fifth emissive layer disposed over the second charge generation layer and comprising a second fluorescent blue emissive material;

wherein:

no emissive layer disposed between the first electrode and the first charge generation layer includes a red emissive material having a peak wavelength in the range 580-700 nm; and no emissive layer disposed over the second charge generation layer includes a red emissive material having a peak wavelength in the range 580-700 nm.

2. The device of claim 1, wherein the second red emissive material is the same material as the first red emissive material.

3. The device of claim 1, wherein the second red emissive material comprises a different material than the first red emissive material.

4. The device of claim 1, wherein the first red emissive material and/or the second red emissive material is a phosphorescent emissive material.

5. The device of claim 1, wherein the second fluorescent blue emissive material comprises a same material as the first fluorescent blue emissive material.

6. The device of claim 1, wherein the second fluorescent blue emissive material comprises a different material than the first fluorescent blue emissive material.

7. The device of claim 1, wherein the third emissive layer has a thickness that is not more than 5 times the thickness of the second emissive layer and/or the fourth emissive layer.

8. The device of claim 1, wherein the third emissive layer has a thickness that is not more than 10 times the thickness of the second emissive layer and/or the fourth emissive layer.

9. An organic light emitting device, comprising:

a substrate;

a first electrode disposed over the substrate;

a second electrode disposed over the first electrode;

a first charge generation layer disposed between the first electrode and the second electrode;

a second charge generation layer disposed over the first charge generation layer;

a first emissive stack disposed between the first electrode and the second electrode, the first emissive stack comprising:

a first emissive layer comprising a first green emissive material;

a second emissive layer comprising a phosphorescent first blue emissive material; and a third emissive layer comprising a second green emissive material;

a second emissive stack disposed between the first electrode and the second electrode, the second emissive stack comprising:

a fourth emissive layer comprising a second blue emissive material; and a third emissive stack disposed between the first electrode and the second electrode, the third emissive stack comprising:

a fifth emissive layer comprising a third blue emissive material;

wherein each emissive stack is separated from any adjacent emissive stack by the first charge generation layer or the second charge generation layer; and wherein the second emissive stack and the third emissive stack exclude emissive layers comprising red emissive materials, each having a peak wavelength in the range 580-700 nm.

10. The device of claim 9, wherein:

the first emissive stack is disposed between the first and second charge generation layers;

the second emissive stack is disposed between the first electrode and the first charge generation layer; and the third emissive stack is disposed between the second electrode and the second charge generation layer.

11. The device of claim 9, wherein at least one of the second blue emissive material and the third blue emissive material comprises a different material than the first blue emissive material.

12. The device of claim 9, wherein at least one of the second blue emissive material and the third blue emissive material comprises a same material as the first blue emissive material.

13. The device of claim 9, wherein at least one of the second blue emissive material and the third blue emissive material is phosphorescent.

14. The device of claim 9, wherein at least one of the second blue emissive material and the third blue emissive material is fluorescent.

15. The device of claim 9, wherein the second green emissive material comprises a same material as the first green emissive material.

16. The device of claim 9, wherein:

the first emissive stack is disposed between the first electrode and the first charge generation layer;

the second emissive stack is disposed between the first and second charge generation layers; and the third emissive stack is disposed between the second electrode and the second charge generation layer.

17. The device of claim 9, wherein:

the first emissive stack is disposed between the second electrode and the second charge generation layer;

the second emissive stack is disposed between the first and second charge generation layers;

the third emissive stack is disposed between the first electrode and the first charge generation layer.

18. The device of claim 9, wherein the second emissive layer has a thickness that is not more than 5 times the thickness of the first emissive layer and/or the third emissive layer.

19. The device of claim 9, wherein the second emissive layer has a thickness that is not more than 10 times the thickness of the first emissive layer and/or the third emissive layer.

20. An organic light emitting device, comprising:

a substrate;

a first electrode disposed over the substrate;

a second electrode disposed over the first electrode;

a first charge generation layer disposed between the first electrode and the second electrode;

a second charge generation layer disposed over the first charge generation layer;

a third charge generation layer disposed over the second charge generation layer;

a first emissive stack disposed between the first electrode and the second electrode, the first emissive stack comprising:

a first emissive layer comprising a first red emissive material;

a second emissive layer comprising a first green emissive material; and a third emissive layer comprising a second red emissive material;

a second emissive stack disposed between the first electrode and the second electrode, the second emissive stack comprising:

a fourth emissive layer comprising a first blue emissive material; and a third emissive stack disposed between the first electrode and the second electrode, the third emissive stack comprising:

a fifth emissive layer comprising a second blue emissive material; and a fourth emissive stack disposed between the first electrode and the second electrode, the fourth emissive stack comprising:

a sixth emissive layer comprising a third blue emissive material;

wherein each emissive stack is separated from any adjacent emissive stack by the first charge generation layer, the second charge generation layer, or the third charge generation layer; and wherein at least two of the second emissive stack, the third emissive stack, and the fourth emissive stack exclude emissive layers comprising red emissive materials having a peak wavelength in the range 580-700 nm.

* * * * *